United States Patent
Kashiyama et al.

(10) Patent No.: US 9,508,573 B2
(45) Date of Patent: Nov. 29, 2016

(54) SUBSTRATE PROCESSING APPARATUS AND SUBSTRATE PROCESSING METHOD

(71) Applicants: Masahito Kashiyama, Kyoto (JP); Shigehiro Goto, Kyoto (JP); Tomohiro Matsuo, Kyoto (JP); Tomohiro Goto, Kyoto (JP)

(72) Inventors: Masahito Kashiyama, Kyoto (JP); Shigehiro Goto, Kyoto (JP); Tomohiro Matsuo, Kyoto (JP); Tomohiro Goto, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 894 days.

(21) Appl. No.: 13/624,536

(22) Filed: Sep. 21, 2012

(65) Prior Publication Data
US 2013/0084393 A1   Apr. 4, 2013

(30) Foreign Application Priority Data

Sep. 29, 2011 (JP) .................. 2011-215458

(51) Int. Cl.
*H01L 21/67* (2006.01)
*H01L 21/68* (2006.01)

(52) U.S. Cl.
CPC ..... *H01L 21/6715* (2013.01); *H01L 21/67259* (2013.01); *H01L 21/681* (2013.01)

(58) Field of Classification Search
CPC ............. H01L 21/67259; H01L 21/67; H01L 21/6715
USPC ........................................... 118/665, 52, 712
See application file for complete search history.

(56) References Cited

U.S. PATENT DOCUMENTS

| | | | |
|---|---|---|---|
| 7,935,217 B2 | 5/2011 | Yashiki et al. | 156/345.17 |
| 2003/0030050 A1 | 2/2003 | Choi | 257/4 |
| 2003/0213431 A1 | 11/2003 | Fukutomi et al. | |
| 2005/0150451 A1* | 7/2005 | Tanaka | H01L 21/6715 118/688 |
| 2006/0185792 A1 | 8/2006 | Yashiki et al. | 156/345.17 |
| 2008/0226830 A1* | 9/2008 | Miyagi | H01L 21/6708 427/402 |
| 2010/0177953 A1 | 7/2010 | Hayashi et al. | 382/145 |
| 2011/0063588 A1 | 3/2011 | Kashiyama et al. | |

FOREIGN PATENT DOCUMENTS

| | | |
|---|---|---|
| JP | 03-080528 | 4/1991 |
| JP | 11-162833 | 6/1999 |

(Continued)

OTHER PUBLICATIONS

Decision to Grant a Patent dated Jun. 25, 2013 in the counterpart Korean Patent Application No. 10-2012-0102617 (2 pages).

(Continued)

*Primary Examiner* — Cachet Sellman
(74) *Attorney, Agent, or Firm* — Ostrolenk Faber LLP

(57) ABSTRACT

A processing liquid is supplied onto a substrate rotated by a spin chuck in a coating processing unit so that a film of the processing liquid is formed, and a rinse liquid is supplied to a peripheral edge of the substrate so that a processing liquid on the peripheral edge of the substrate is removed. An edge cut width between a position of an outer peripheral portion of the substrate rotated by the spin chuck in an edge exposure unit and a position of an outer peripheral portion of a film on the substrate is detected. Based on the detected edge cut width, a positional deviation of the center of the substrate held in the spin chuck from a rotation center of the spin chuck in the coating processing unit is determined while a supply state of the rinse liquid by an edge rinse nozzle is determined.

10 Claims, 20 Drawing Sheets

(56) References Cited

FOREIGN PATENT DOCUMENTS

| | | |
|---|---|---|
| JP | 11-283895 | 10/1999 |
| JP | 2004-518293 | 6/2004 |
| JP | 2005-203440 | 7/2005 |
| JP | 2006-237063 | 9/2006 |
| JP | 2007-221070 | 8/2007 |
| JP | 2009-32898 | 2/2009 |
| JP | 2011-66049 | 3/2011 |
| KR | 10-2005-0099880 A | 10/2005 |
| KR | 10-0564780 B1 | 3/2006 |
| KR | 10-2007-0000922 A | 1/2007 |
| WO | WO 2008/018537 A1 | 2/2008 |

OTHER PUBLICATIONS

Notice of Reasons for Refusal dated Mar. 17, 2015 for corresponding Japanese Patent Application No. 2011-215458.

Office Action dated Sep. 10, 2014 in counterpart Taiwanese Patent Application.

* cited by examiner

FIG. 11
(a)
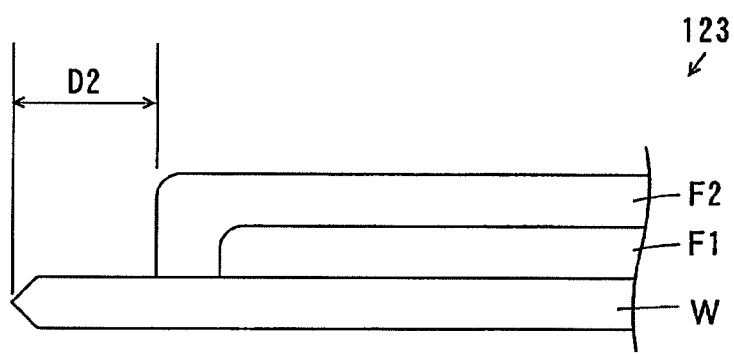
(b)
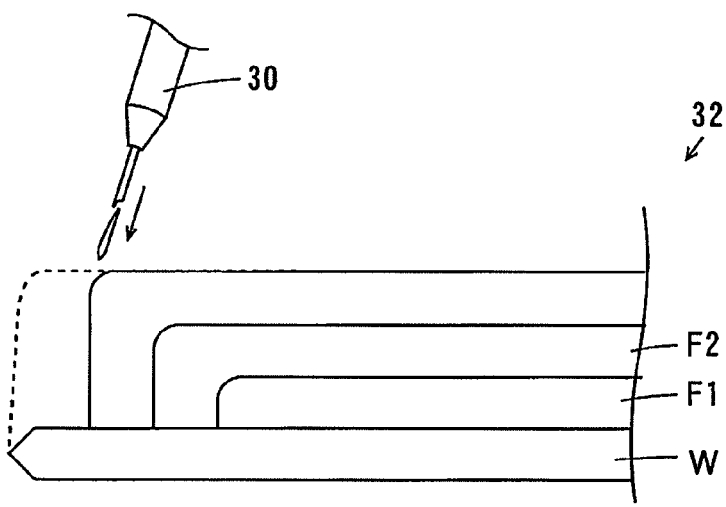
(c)
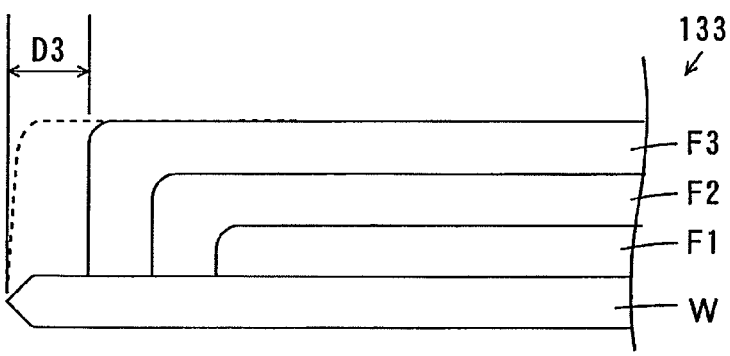

FIG. 18
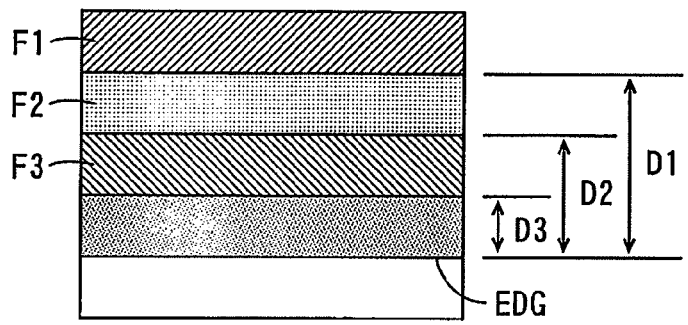
(a)
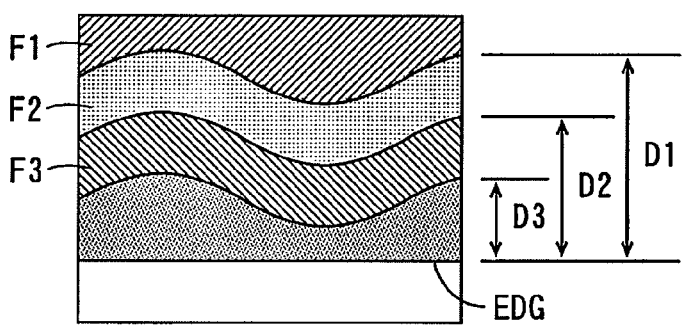
(b)
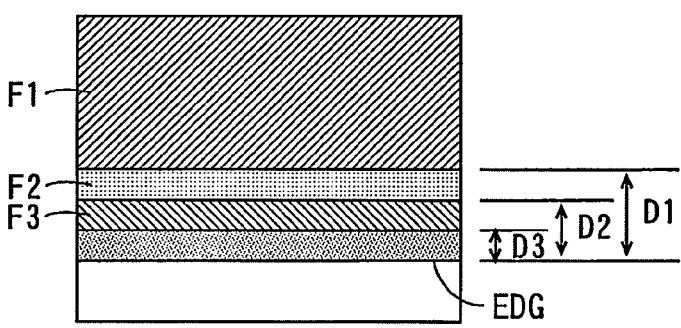
(c)
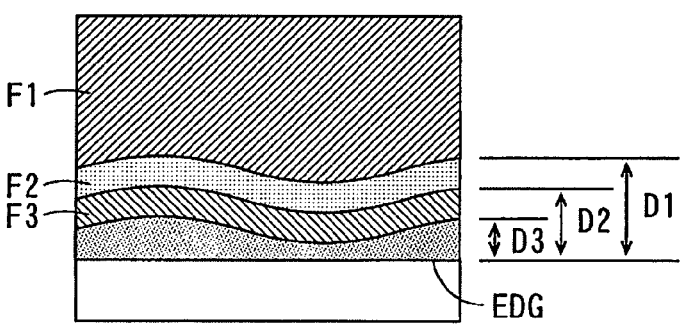
(d)

SUBSTRATE PROCESSING APPARATUS AND SUBSTRATE PROCESSING METHOD

BACKGROUND OF THE INVENTION (1) Field of the Invention

The present invention relates to a substrate processing apparatus and a substrate processing method.

(2) Description of Related Art

Substrate processing apparatuses are used to subject various substrates such as semiconductor substrates, and substrates for liquid crystal displays, plasma displays, optical disks, magnetic disks, magneto-optical disks, and photomasks to various types of processing (see JP 2009-32898 A, for example).

The substrate processing apparatus discussed in JP 2009-32898 A includes a coating processing unit that forms a resist film on a substrate, a development processing unit that performs development processing for a resist film on the substrate, a transport robot that transports the substrate, and an edge exposure unit that performs exposure processing for a peripheral edge of the resist film on the substrate. In the edge exposure unit, exposure processing is performed when the substrate held in a holding and rotating unit is rotated while a peripheral edge of the substrate is irradiated with light. Edge data representing an edge of the substrate held in the holding and rotating unit is acquired. Based on the edge data, an amount of eccentricity of the center of the substrate from a rotation center of the holding and rotating unit is calculated. Thus, the presence or absence of an abnormality in the amount of eccentricity of the substrate in the edge exposure unit can be determined.

In the coating processing unit, a resist liquid is supplied onto the substrate rotated by a spin chuck. At this time, a rinse liquid is supplied to the peripheral edge of the substrate so that a resist liquid on the peripheral edge of the substrate is removed. Thus, a resist film is formed in a region excluding the peripheral edge of the substrate. Since the resist film is not formed on the peripheral edge of the substrate, a holder in a transport robot can hold the peripheral edge, where no resist film exists, of the substrate.

If the rotation center of the spin chuck in the coating processing unit is eccentric from the rotation center of the substrate, however, the width of the peripheral edge, where no resist film exists, of the substrate varies. If a supply state of the rinse liquid is not appropriate, the width of the peripheral edge, where no resist film exists, of the substrate cannot be made appropriate. Thus, the holder in the transport robot may contact a part of the resist film on the substrate. As a result, the resist film on the substrate may be damaged, and particles of the resist film may be generated.

The edge exposure unit discussed in JP 2009-32898 A can neither detect an abnormality in the amount of eccentricity of the substrate in the coating processing unit nor detect a supply state of the rinse liquid in the coating processing unit.

BRIEF SUMMARY OF THE INVENTION

The present invention is directed to providing a substrate processing apparatus and a substrate processing method capable of detecting a positional deviation between a rotation center of a substrate and a geometric center of the substrate during supply of a processing liquid and a supply state of a removal liquid.

(1) According to an aspect of the present invention, a substrate processing apparatus that processes a substrate having an outer peripheral portion, at least a part of which is circular, includes a film formation unit that forms a film of a processing liquid on the substrate, a detection unit that detects a state of the substrate after film formation by the film formation unit, and a controller that makes determination based on a detection result of the detection unit, in which the film formation unit includes a first rotating and holding device that holds and rotates the substrate, a processing liquid supplier that supplies the processing liquid onto the substrate rotated by the first rotating and holding device, to form a film of the processing liquid, and a removal liquid supplier that supplies a removal liquid to a peripheral edge of the substrate rotated by the first rotating and holding device, to remove the processing liquid on the peripheral edge of the substrate, the detection unit includes a second rotating and holding device that holds and rotates the substrate, and a position detector that detects a position of the outer peripheral portion of the substrate rotated by the second rotating and holding device and a position of an outer peripheral portion of the film on the substrate, and the controller determines a positional deviation of the center of the substrate held in the first rotating and holding device from a rotation center of the first rotating and holding device based on the position of the outer peripheral portion of the substrate and the position of the outer peripheral portion of the film on the substrate, which have been detected by the position detector, while determining a supply state of the removal liquid by the removal liquid supplier in the film formation unit.

In this substrate processing apparatus, the first rotating and holding device in the film formation unit holds and rotates the substrate. The processing liquid is supplied onto the rotated substrate so that the film of the processing liquid is formed. The removal liquid is supplied onto the peripheral edge of the rotated substrate so that the processing liquid on the peripheral edge of the substrate is removed.

The second rotating and holding device in the detection unit then holds and rotates the substrate. The position of the outer peripheral portion of the rotated substrate and the position of the outer peripheral portion of the film on the substrate are detected. In this case, the positional deviation of the center of the substrate held in the first rotating and holding device from the rotation center of the first rotating and holding device based on the detected position of the outer peripheral portion of the substrate and the detected position of the outer peripheral portion of the film on the substrate while the supply state of the removal liquid by the removal liquid supplier in the film formation unit is determined. This enables the positional deviation between the rotation center of the substrate and a geometric center of the substrate during supply of the processing liquid and the supply state of the removal liquid to be detected.

(2) The position detector may include an image data detector that detects image data representing a position of the outer peripheral portion of the substrate rotated by the second rotating and holding device and the position of the outer peripheral portion of the film on the substrate, and the controller may detect a change in the position of the outer peripheral portion of the substrate in a radial direction of the substrate and a change in the position of the outer peripheral portion of the film on the substrate based on the image data detected by the image data detector, and determine the positional deviation of the center of the substrate based on the detected change in the position of the outer peripheral portion of the substrate and the detected change in the position of the outer peripheral portion of the film on the substrate while determining the supply state of the removal liquid.

In this case, the change in the position of the outer peripheral portion of the substrate in the radial direction of the substrate and the change in the position of the outer peripheral portion of the film on the substrate are detected based on the image data detected by the image data detector. The positional deviation of the center of the substrate is determined based on the detected change in the position of the outer peripheral portion of the substrate and the detected change in the position of the outer peripheral portion of the film on the substrate while the supply state of the removal liquid is determined. This enables the positional deviation between the rotation center of the substrate and the geometric center of the substrate during supply of the processing liquid and the supply state of the removal liquid to be easily detected by image processing.

(3) The controller may calculate the width of the outer peripheral portion, where no film exists, of the substrate based on the change in the position of the outer peripheral portion of the substrate in the radial direction of the substrate and the change in the position of the outer peripheral portion of the film on the substrate, and determine the positional deviation of the center of the substrate based on the calculated width while determining the supply state of the removal liquid.

In this case, the width of the outer peripheral portion, where no film exists, of the substrate is calculated based on the change in the position of the outer peripheral portion of the substrate in the radial direction of the substrate and the change in the position of the outer peripheral portion of the film on the substrate. The positional deviation of the center of the substrate may be determined based on the calculated width while the supply state of the removal liquid may be determined. This enables the positional deviation between the rotation center of the substrate and the geometric center of the substrate during supply of the processing liquid and the supply state of the removal liquid to be reliably detected.

(4) The controller may determine the positional deviation of the center of the substrate based on a difference between a maximum value and a minimum value of the calculated width while determining the supply state of the removal liquid based on an average value of the calculated width.

In this case, the positional deviation of the center of the substrate is determined based on the difference between the maximum value and the minimum value of the calculated width while the supply state of the removal liquid is determined based on the average value of the calculated width. This enables the positional deviation between the rotation center of the substrate and the geometric center of the substrate during supply of the processing liquid and the supply state of the removal liquid to be detected more reliably.

(5) The supply state of the removal liquid may include at least one of the flow rate of the removal liquid supplied to the outer peripheral portion of the substrate by the removal liquid supplier and a supply position of the removal liquid to the outer peripheral portion of the substrate by the removal liquid supplier.

In this case, at least one of the flow rate of the removal liquid supplied to the outer peripheral portion of the substrate by the removal liquid supplier and the supply position of the removal liquid to the outer peripheral portion of the substrate by the removal liquid supplier is detected as the supply state of the removal liquid.

(6) The substrate processing apparatus may further include a substrate transport device including a holder that holds and transports the substrate while placing the held substrate on the first rotating and holding device in the film formation unit, in which the controller may adjust a placement operation of the substrate on the first rotating and holding device by the holder in the transport device based on a determination result of the positional deviation of the center of the substrate.

In this case, the placement operation of the substrate on the first rotating and holding device by the holder in the transport device is adjusted based on the determination result of the positional deviation of the center of the substrate. This enables the positional deviation between the rotation center of the substrate and the geometric center of the substrate during supply of the processing liquid to be reduced. This results in an improvement in the accuracy of substrate processing.

(7) The controller may at least output an alarm or adjust the supply state of the removal liquid by the removal liquid supplier when a determination result of the supply state of the removal liquid by the controller represents an abnormality.

In this case, when the supply state of the removal liquid is not appropriate, the alarm is output so that a worker can be urged to adjust the supply state of the removal liquid, or the supply state of the removal liquid by the removal liquid supplier is adjusted. This results in an improvement in the accuracy of substrate processing.

(8) The film formation unit may form a photosensitive film as the film of the processing liquid, and the detection unit may be an edge exposure unit further having a function of performing exposure processing for the peripheral edge of the film on the substrate.

In this case, the edge exposure unit has a function of detecting the state of the substrate while having the function of performing the exposure processing for the peripheral edge of the film on the substrate. This can prevent the substrate processing apparatus from increasing in size and footprint.

(9) According to another aspect of the present invention, a substrate processing method for processing a substrate having an outer peripheral portion, at least a part of which is circular, includes the steps of holding and rotating the substrate by a first rotating and holding device in a film formation unit, supplying a processing liquid by a processing liquid supplier in the film formation unit onto the substrate rotated by the first rotating and holding unit, to form a film of the processing liquid, supplying a removal liquid by a removal liquid supplier in the film formation unit to a peripheral edge of the substrate rotated by the first rotating and holding unit, to remove the processing liquid on the peripheral edge of the substrate, holding and rotating the substrate by a second rotating and holding device in a detection unit, detecting a position of the outer peripheral portion of the substrate rotated by the second rotating and holding device and a position of an outer peripheral portion of the film on the substrate, and determining a positional deviation of the center of the substrate held in the first rotating and holding device from a rotation center of the first rotating and holding device based on the detected position of the outer peripheral portion of the substrate and the detected position of the outer peripheral portion of the film on the substrate while determining a supply state of the removal liquid by the removal liquid supplier in the film formation unit.

In this substrate processing method, the first rotating and holding device in the film formation unit holds and rotates the substrate. The processing liquid is supplied onto the rotated substrate so that the film of the processing liquid is formed. The removal liquid is supplied onto the peripheral edge of the rotated substrate so that the processing liquid on the peripheral edge of the substrate is removed.

The second rotating and holding device in the detection unit then holds and rotates the substrate. The position of the outer peripheral portion of the rotated substrate and the position of the outer peripheral portion of the film on the substrate are detected. In this case, the positional deviation of the center of the substrate held in the first rotating and holding device from the rotation center of the first rotating and holding device is determined based on the detected position of the outer peripheral portion of the substrate and the detected position of the outer peripheral portion of the film on the substrate while the supply state of the removal liquid by the removal liquid supplier in the film formation unit is determined. This enables the positional deviation between the rotation center of the substrate and the geometric center of the substrate during supply of the processing liquid and the supply state of the removal liquid to be detected.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 11 (a) to 11 (c) illustrate a procedure for formation of an anti-reflection film, a resist film, and a resist cover film on a surface of a substrate, and a removal range of each of the films;

FIGS. 18 (a) to 18 (d) illustrate a distribution of brightnesses of a peripheral edge image displayed based on peripheral edge image data;

DESCRIPTION OF THE PREFERRED EMBODIMENTS

A substrate processing apparatus and a substrate processing method according to an embodiment of the present invention will be described below with reference to the drawings. In the following description, substrates refer to semiconductor substrates, substrates for liquid crystal displays, plasma displays, optical disks, magnetic disks, magneto-optical disks, or photomasks, or glass substrates for photomasks.

The substrate used in the present embodiment has an outer peripheral portion, at least a part of which is circular. For example, the outer peripheral portion excluding a cutout for positioning (an orientation flat or a notch) has a circular shape.

(1) Configuration of Substrate Processing System

Figure 1:
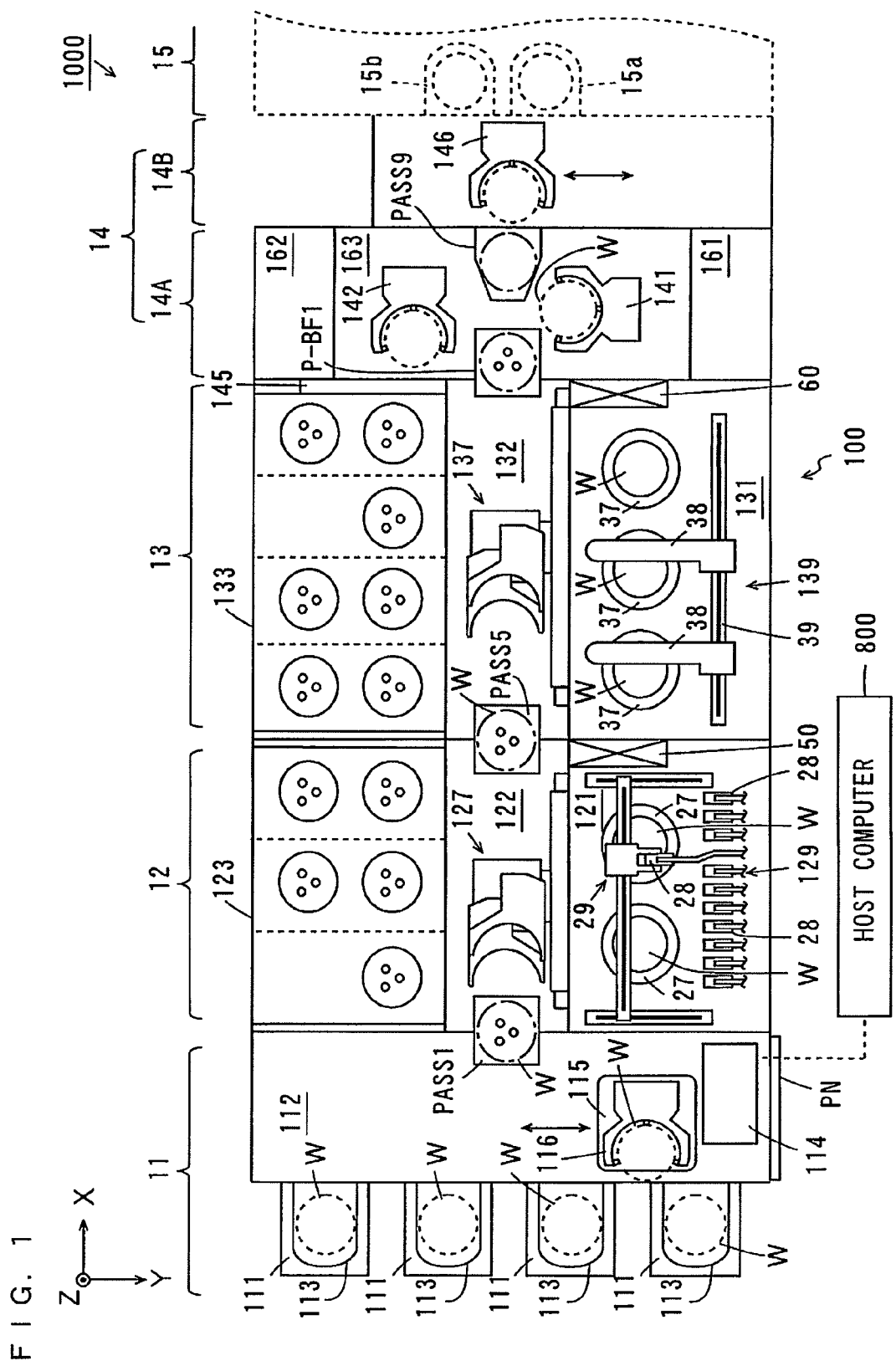
FIG. 1 is a schematic plan view of a substrate processing system according to an embodiment of the present invention.

FIG. 1 is a schematic plan view of a substrate processing system according to an embodiment of the present invention.

Figure 2:
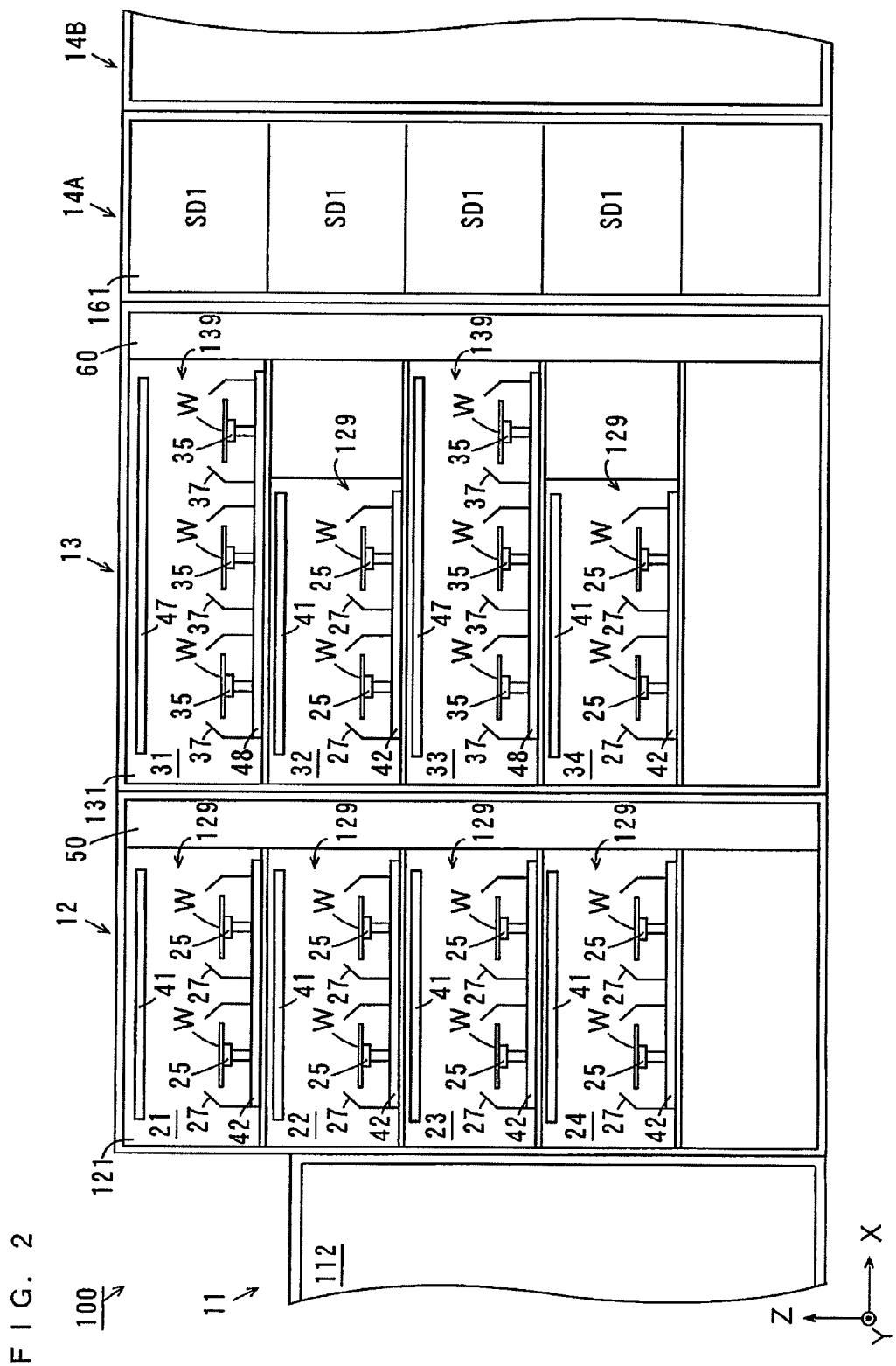
FIG. 2 illustrates a coating processing section, a coating/development processing section, and a washing/drying processing section illustrated in FIG. 1 as viewed in a +Y-direction.

FIG. 1 and predetermined ones of FIG. 2 and the subsequent drawings are accompanied by arrows indicating an X-direction, a Y-direction, and a Z-direction that are perpendicular to one another to clarify a positional relationship. The X-direction and the Y-direction are perpendicular to each other in a horizontal plane, and the Z-direction corresponds to a vertical direction. In each of the directions, a direction directed by the arrow is a +direction, and a direction opposite thereto is a −direction.

As illustrated in FIG. 1, a substrate processing system 1000 includes a substrate processing apparatus 100 and a host computer 800.

The substrate processing apparatus 100 includes an indexer block 11, a first processing block 12, a second processing block 13, a washing/drying processing block 14A, and a carry-in/carry-out block 14B. The washing/drying processing block 14A and the carry-in/carry-out block 14B constitute an interface block 14. An exposure device 15 is arranged adjacent to the carry-in/carry-out block 14B. In the exposure device 15, a substrate W is subjected to exposure processing using an immersion method.

As illustrated in FIG. 1, the indexer block 11 includes a plurality of carrier platforms 111 and a transport section 112. A carrier 113 that stores a plurality of substrates W in multiple stages is placed on each of the carrier platforms 111. While a front opening unified pod (FOUP) is used as the carrier 113 in the present embodiment, the present invention is not limited to this. For example, a standard mechanical inter face (SMIF) pod or an open cassette (OC) that exposes the stored substrate W to outside air may be used.

The transport section 112 includes a main controller 114 and a transport mechanism 115. The main controller 114 controls various constituent elements in the substrate processing apparatus 100. The main controller 114 is connected to the host computer 800 by wire communication or wireless communication. Various types of data are transmitted and received between the main controller 114 and the host computer 800.

Figure 6:
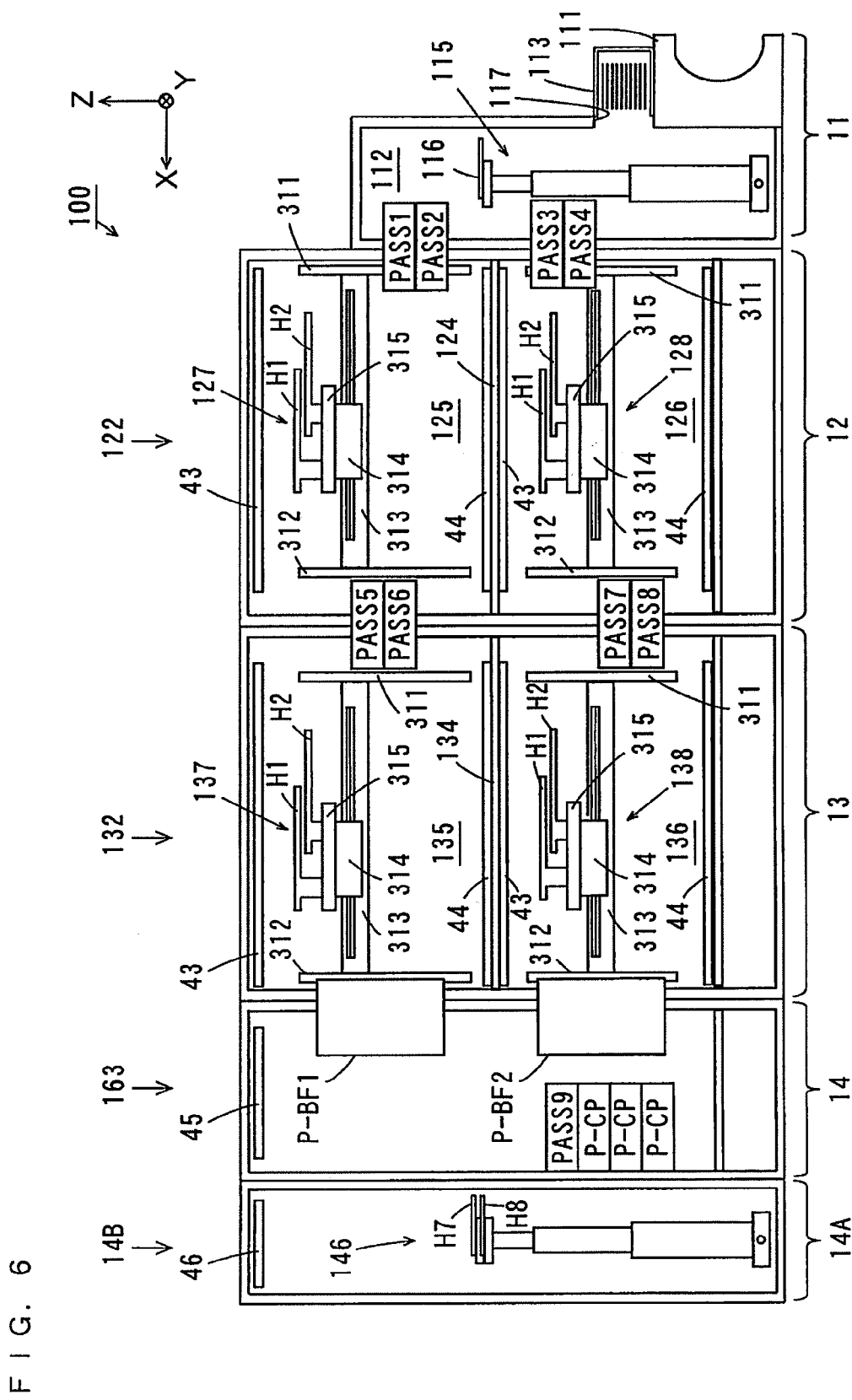
FIG. 6 illustrates the transport sections as viewed in the −Y-direction.

The transport mechanism 115 has a hand 116 for holding the substrate W. The transport mechanism 115 transports the substrate W while holding the substrate W with the hand 116. As illustrated in FIG. 6, described below, an opening 117 is formed in the transport section 112 to transfer and receive the substrate W between the carrier 113 and the transport mechanism 115.

A main panel PN is provided on a side surface of the transport section 112. A main panel PN is connected to the main controller 114. A user can confirm a processing status of the substrate W in the substrate processing apparatus 100 using the main panel PN.

An operation unit (see FIG. 16, described below) including a keyboard, for example, is provided in the vicinity of the main panel PN. The user can perform operation setting of the substrate processing apparatus 100 by operating the operation unit.

The first processing block 12 includes a coating processing section 121, a transport section 122, and a thermal processing section 123. The coating processing section 121 and the thermal processing section 123 are opposed to each other with the transport section 122 sandwiched therebetween. A substrate platform PASS1 on which the substrate W is placed and substrate platforms PASS2 to PASS4 (see FIG. 6), described below, are provided between the transport section 122 and the indexer block 11. The transport section 122 includes a transport mechanism 127 that transports the substrate W and a transport mechanism 128 (see FIG. 6), described below.

The second processing block 13 includes a coating/development processing section 131, a transport section 132, and a thermal processing section 133. The coating/development processing section 131 and the thermal processing section 133 are opposed to each other with the transport section 132 sandwiched therebetween. A substrate platform PASS5 on which the substrate W is placed and substrate platforms PASS6 to PASS8 (see FIG. 6), described below, are provided between the transport section 132 and the transport section 122. The transport section 132 includes a transport mechanism 137 that transports the substrate W and a transport mechanism 138 (see FIG. 6), described below. In the second processing block 13, a packing 145 is provided between the thermal processing section 133 and the interface block 14.

The washing/drying processing block 14A includes washing/drying processing sections 161 and 162 and a transport section 163. The washing/drying processing sections 161 and 162 are opposed to each other with the transport section 163 sandwiched therebetween. The transport section 163 includes transport mechanisms 141 and 142.

A placement/buffer section P-BF1 and a placement/buffer section P-BF2 (see FIG. 6), described below, are provided between the transport section 163 and the transport section 132. Each of the placement/buffer sections P-BF1 and P-BF2 can store a plurality of substrates W.

A substrate platform PASS9 and placement/cooling sections P-CP (see FIG. 6), described below, are provided adjacent to the carry-in/carry-out block 14B between the transport mechanisms 141 and 142. Each placement/cooling section P-CP has a function of cooling the substrate W (e.g., a cooling plate). In each placement/cooling section P-CP, the substrate W is cooled to a temperature suitable for exposure processing.

The carry-in/carry-out block 14B includes a transport mechanism 146. The transport mechanism 146 carries the substrate W into and out of the exposure device 15. The exposure device 15 includes a substrate carry-in section 15a for carrying in the substrate W and a substrate carry-out section 15b for carrying out the substrate W. The substrate carry-in section 15a and the substrate carry-out section 15b in the exposure device 15 may be arranged adjacent to each other in a horizontal direction, or may be arranged one over the other.

The carry-in/carry-out block 14B is movable in a +Y-direction and a −Y-direction relative to the washing/drying processing block 14A. When the washing/drying processing block 14A, the carry-in/carry-out block 14B, and the exposure device 15 are maintained, a work space can be ensured by moving the carry-in/carry-out block 14B in the +Y-direction or the −Y-direction. The carry-in/carry-out block 14B is lighter in weight than the other blocks, and can be easily moved.

In the washing/drying processing block 14A, a large amount of liquid (e.g., a cleaning liquid and a rinse liquid) is used in the washing/drying processing sections 161 and 162. Thus, the washing/drying processing block 14A needs to be reliably connected to power usage facilities for supplying the liquid. On the other hand, in the carry-in/carry-out block 14B, the liquid is hardly used. Thus, the carry-in/carry-out block 14B can be simply connected to the power usage facilities. More specifically, the carry-in/carry-out block 14B can be easily disconnected and reconnected from and to the power usage facilities.

When the washing/drying processing block 14A, the carry-in/carry-out block 14B, and the exposure device 15 are maintained, therefore, labor and working time of a worker can be significantly reduced without moving the washing/drying processing block 14A but moving only the carry-in/carry-out block 14B.

(2) Configuration of Coating Processing Section and Development Processing Section FIG. 2 illustrates the coating processing section 121, the coating/development processing section 131, and the washing/drying processing section 161 illustrated in FIG. 1 as viewed in the +Y-direction.

As illustrated in FIG. 2, the coating processing section 121 has coating processing chambers 21, 22, 23, and 24 hierarchically provided therein. Each of the coating processing chambers 21 to 24 includes a coating processing unit 129. The coating/development processing section 131 has development processing chambers 31 and 33 and coating processing chambers 32 and 34 hierarchically provided therein. Each of the development processing chambers 31 and 33 includes a development processing unit 139, and each of the coating processing chambers 32 and 34 includes a coating processing unit 129.

Figure 3:
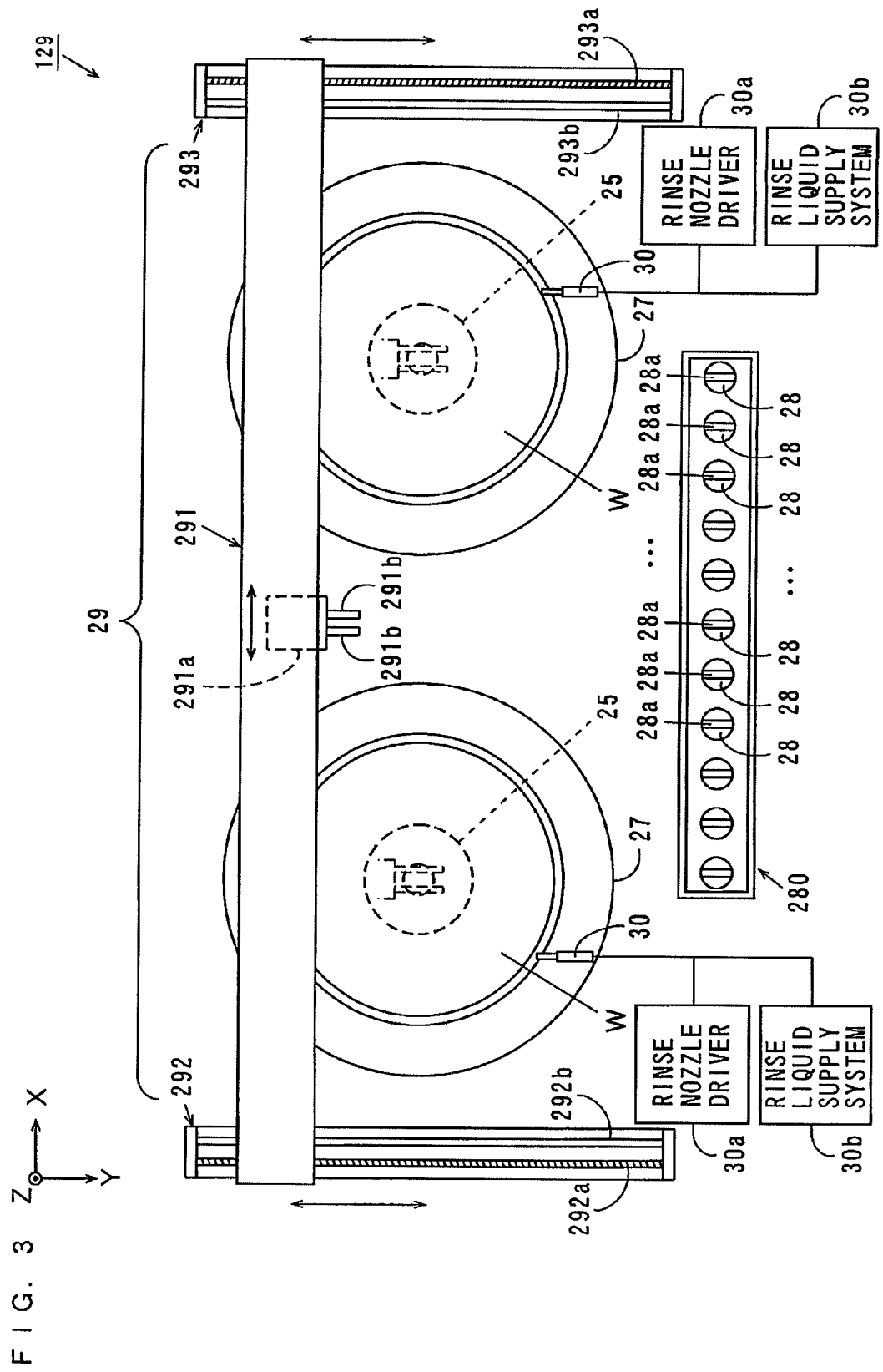
FIG. 3 illustrates a coating processing unit as viewed in a +Z-direction.

FIG. 3 illustrates the coating processing unit 129 as viewed in a +Z-direction. As illustrated in FIGS. 2 and 3, each of the coating processing units 129 includes a plurality of spin chucks 25, a plurality of cups 27, a plurality of processing liquid nozzles 28, a plurality of edge rinse nozzles 30, and a plurality of waiting sections 280. In the present embodiment, each of the coating processing units 129 includes two spin chucks 25, two cups 27, and two edge rinse nozzles 30.

Each of the spin chucks 25 is driven to rotate by a driving device (e.g., an electric motor), which is not illustrated, with the substrate W held therein. The cup 27 surrounds the spin chuck 25. During waiting, each of the processing liquid nozzles 28 is inserted into the waiting section 280. Various processing liquids, described below, are supplied into each of the processing liquid nozzles 28 from a processing liquid storage (not illustrated) via a processing liquid piping (not illustrated). Each of the processing liquid nozzles 28 is provided with a gripper 28a that projects upward.

The coating processing unit 129 includes an edge rinse nozzle driver 30a and a rinse liquid supply system 30b. An edge rinse nozzle 30 is movably provided above the spin chuck 25. The edge rinse nozzle driver 30a moves the edge rinse nozzle 30. The rinse liquid supply system 30b supplies a rinse liquid (e.g., a solvent of a coating liquid) to the edge rinse nozzle 30. The rinse liquid supply system 30b includes a flow sensor that measures the flow rate of the rinse liquid supplied to the edge rinse nozzle 30. The edge rinse nozzle 30 discharges the rinse liquid to a peripheral edge of the substrate W held by the spin chuck 25. The rinse liquid supply system 30b adjusts the flow rate of the rinse liquid discharged to the substrate W from the edge rinse nozzle 30.

The coating processing unit 129 includes a nozzle transport mechanism 29 that transports the processing liquid nozzle 28. The nozzle transport mechanism 29 includes a nozzle gripper 291a and long-sized gripper moving mechanisms 291, 292, and 293. The gripper moving mechanism 292 is fixed close to the transport section 112 illustrated in FIG. 2 to extend in the Y-direction. The gripper moving mechanism 293 is fixed close to the second processing block 13 illustrated in FIG. 2 to extend in the Y-direction. The gripper moving mechanism 292 includes a ball screw 292a and a guide 292b that extend in the Y-direction. Similarly, the gripper moving mechanism 293 includes a ball screw 293a and a guide 293b that extend in the Y-direction.

The gripper moving mechanism 291 is provided to extend in the X-direction between the gripper moving mechanism 292 and the gripper moving mechanism 293. Both ends of the gripper moving mechanism 291 are respectively attached to guides 292b and 293b in the gripper moving mechanisms 292 and 293 to be movable in the Y-direction. One end of the gripper moving mechanism 291 engages with the ball screw 292a in the gripper moving mechanism 292. The other end of the gripper moving mechanism 291 is connected to the ball screw 293a in the gripper moving mechanism 293. The ball screws 292a and 293a are rotated by a motor (not illustrated). Thus, the gripper moving mechanism 291 horizontally moves in the Y-direction along the guides 292b and 293b.

The nozzle gripper 291a is attached to the gripper moving mechanism 291 to be movable in the X-direction. The nozzle gripper 291a includes a pair of nipping arms 291b that nips the gripper 28a of each of the processing liquid nozzles 28. The nipping arms 291b move nearer to or away from each other by a driving mechanism (not illustrated).

In the coating processing unit 129, any one of the plurality of processing liquid nozzles 28 is moved toward a position above the substrate W by the nozzle transport mechanism 29. A processing liquid is applied onto the substrate W to be rotated by being discharged from the processing liquid nozzle 28 while the spin chuck 25 is rotating. The edge rinse nozzle 30 is moved to the vicinity of the peripheral edge of the substrate W from a predetermined waiting position. The peripheral edge of the substrate W refers to a region having a predetermined width along the outer peripheral portion of the substrate W on the surface of the substrate W. When the rinse liquid is discharged toward the peripheral edge of the substrate W to be rotated from the edge rinse nozzle 30 while the spin chuck 25 is rotating, a peripheral edge of the processing liquid, which has been applied onto the substrate W, is dissolved. Thus, the processing liquid at the peripheral edge of the substrate W is removed.

In the present embodiment, in the coating processing units 129 in the coating processing chambers 22 and 24 illustrated in FIG. 2, a processing liquid for an anti-reflection film (an anti-reflection liquid) is supplied to the substrate W from the processing liquid nozzle 28. In the coating processing units 129 in the coating processing chambers 21 and 23, a processing liquid for a resist film (a resist liquid) is supplied to the substrate W from the processing liquid nozzle 28. In the coating processing units 129 in the coating processing chambers 32 and 34, a processing liquid for a resist cover film (a resist cover liquid) is supplied to the substrate W from the processing liquid nozzle 28.

As illustrated in FIG. 2, the development processing unit 139 includes a plurality of spin chucks 35 and a plurality of cups 37, similarly to the coating processing unit 129. As illustrated in FIG. 1, the development processing unit 139 includes two slit nozzles 38 that discharge a development liquid and a moving mechanism 39 that moves the slit nozzles 38 in the X-direction.

In the development processing unit 139, one of the slit nozzles 38 first supplies the development liquid to each of the substrates W while moving in the X-direction. Then, the other slit nozzle 38 supplies the development liquid to each of the substrates W while moving. When the development liquid is supplied to the substrate W from the slit nozzle 38, the spin chuck 35 is rotated by a driving device (not illustrated). Thus, the substrate W is rotated.

In the present embodiment, the development liquid is supplied to the substrate W in the development processing unit 139 so that the resist cover film on the substrate W is removed while the substrate W is subjected to development processing. In the present embodiment, different development liquids are respectively discharged from the two slit nozzles 38. Thus, two types of development liquids can be supplied to each of the substrates W.

While in an example illustrated in FIG. 2, the coating processing unit 129 includes two cups 27, and the development processing unit 139 includes three cups 37, the coating processing unit 129 may include three cups 27, or the development processing unit 139 may include two cups 37.

The washing/drying processing section 161 includes a plurality of (four in this example) washing/drying processing units SD1. In the washing/drying processing unit SD1, the substrate W before exposure processing is subjected to washing and drying processing.

In the washing/drying processing unit SD1, a reverse surface of the substrate W and an end (bevel portion) of the substrate W may be subjected to polishing processing using a brush or the like. The reverse surface of the substrate W refers to a surface opposite to a surface, on which various patterns such as a circuit pattern are formed, of the substrate W.

As illustrated in FIG. 2, above the coating processing unit 129 in each of the coating processing chambers 21 to 24, 32, and 34, an air supply unit 41 for supplying clean air, the temperature and humidity of which have been regulated, to the coating processing chamber is provided. Above the development processing unit 139 in each of the development processing chambers 31 and 33, an air supply unit 47 for supplying clean air, the temperature and humidity of which have been regulated, to the development processing chamber is provided.

In each of the coating processing chambers 21 to 24, 32, and 34, an exhaust unit 42 for exhausting an atmosphere in the cup 27 is provided in a lower part of the coating processing unit 129. In each of the development processing chambers 31 and 33, an exhaust unit 48 for exhausting an atmosphere in the cup 37 is provided in a lower part of the development processing unit 139.

As illustrated in FIGS. 1 and 2, a fluid box 50 is provided adjacent to the coating/development processing section 131 in the coating processing section 121. Similarly, a fluid box 60 is provided adjacent to the washing/drying processing block 14A in the coating/development processing section 131. Fluid-related elements such as conduits, joints, valves, flow meters, regulators, pumps, and temperature regulators relating to supply of a chemical liquid to the coating processing unit 129 and the development processing unit 139 and drainage of a fluid and exhaust of air from the coating processing unit 129 and the development processing unit 139 are stored in the fluid box 50 and the fluid box 60.

(3) Configuration of Thermal Processing Section

Figure 4:
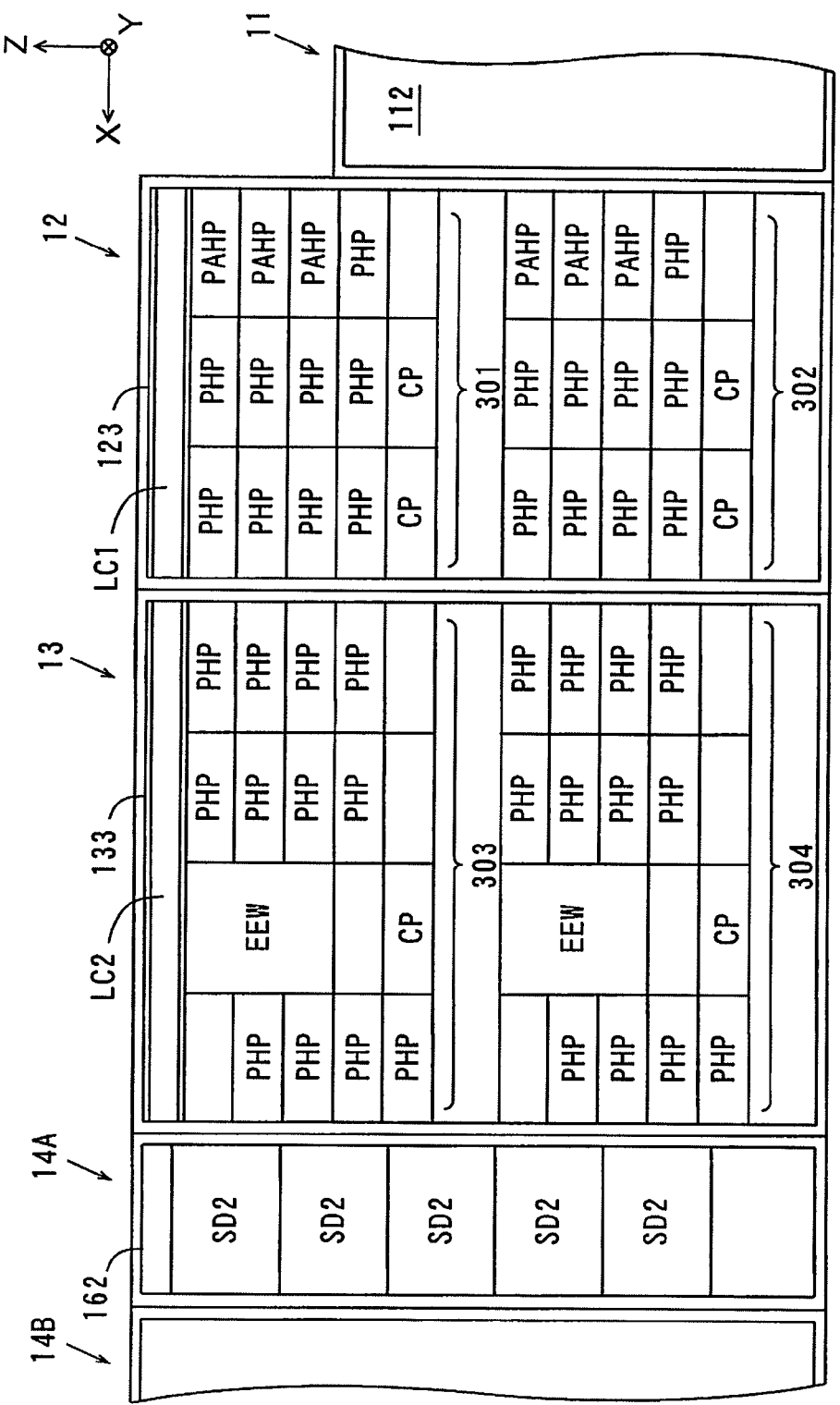
FIG. 4 illustrates thermal processing sections and a washing/drying processing section illustrated in FIG. 1 as viewed in a −Y-direction.

FIG. 4 illustrates the thermal processing sections 123 and 133 and the washing/drying processing section 162 illustrated in FIG. 1 as viewed in the −Y-direction.

As illustrated in FIG. 4, the thermal processing section 123 includes an upper thermal processing section 301 provided in its upper part and a lower thermal processing section 302 provided in its lower part. Each of the upper thermal processing section 301 and the lower thermal processing section 302 includes a plurality of thermal processing units PHP, a plurality of adhesion reinforcement processing units PAHP, and a plurality of cooling units CP. A local controller LC1 is provided in an uppermost part of the thermal processing section 123.

The local controller LC1 performs temperature control of the thermal processing units PHP, the adhesion reinforcement processing units PAHP, and the cooling units CP in the thermal processing section 123. The local controller LC1 controls an operation of the nozzle transport mechanism 29, an operation of the spin chuck 25, supply of the processing liquid to each of the processing liquid nozzles 28, and supply of the rinse liquid to the edge rinse nozzle 30 in the coating processing unit 129 illustrated in FIG. 3. Further, the local controller LC1 controls an operation of the transport mechanism 127 illustrated in FIG. 1.

In the thermal processing unit PHP, the substrate W is subjected to heating processing and cooling processing. In the adhesion reinforcement processing unit PAHP, adhesion reinforcement processing for improving adhesion between the substrate W and an anti-reflection film is performed. More specifically, in the adhesion reinforcement processing unit PAHP, the substrate W is coated with an adhesion reinforcing agent such as hexamethyldisilazane (HMDS) while being subjected to heating processing. In the cooling unit CP, the substrate W is subjected to cooling processing.

The thermal processing section 133 includes an upper thermal processing section 303 provided in its upper part and a lower thermal processing section 304 provided in its lower part. Each of the upper thermal processing section 303 and the lower thermal processing section 304 includes a cooling unit CP, a plurality of thermal processing units PHP, and an edge exposure unit EEW. A local controller LC2 is provided in an uppermost part of the thermal processing section 133.

The local controller LC2 performs temperature control of the thermal processing unit PHP and the cooling unit CP in the thermal processing section 133. The local controller LC2 controls an operation of the nozzle transport mechanism 29, an operation of the spin chuck 25, supply of the processing liquid to each of the processing liquid nozzles 28, and supply of the rinse liquid to the edge rinse nozzle 30 in the coating processing unit 129 illustrated in FIG. 3. Further, the local controller LC2 controls an operation of the transport mechanism 137 illustrated in FIG. 1 while controlling an operation of the moving mechanism 39, an operation of the spin chuck 35, and supply of the development liquid to each of the slit nozzles 38. Details of the local controllers LC1 and LC2 will be described below.

In the edge exposure unit EEW, a state of the peripheral edge of the substrate W is detected, as described below. It is determined based on a detection result whether the substrate W is placed on the spin chuck 25 so that a geometric center of the substrate W (hereinafter referred to as the center of the substrate W) matches an axis of the spin chuck 25 or not in the coating processing unit 129 (FIG. 2) and whether the flow rate of the rinse liquid discharged from the edge rinse nozzle 30 (FIG. 3) to the peripheral edge of the substrate W and a discharge position of the rinse liquid are appropriate or not. The axis of the spin chuck 25 corresponds to a rotation center of the substrate W. An amount of eccentricity of the center of the substrate W from the axis of the spin chuck 25 is hereinafter referred as an amount of eccentricity of the substrate W. When the amount of eccentricity of the substrate W exceeds a previously set allowable upper-limit value or when the flow rate of the rinse liquid discharged to the substrate W or the discharge position of the rinse liquid is not appropriate, processing, described below, is performed. A cutout for positioning (an orientation flat or a notch) may be formed in the outer peripheral portion of the substrate W.

In the edge exposure unit EEW, exposure processing for the peripheral edge of the substrate W (edge exposure processing) is then performed. The substrate W is subjected to the edge exposure processing so that the resist film on the peripheral edge of the substrate W is removed at the time of later development processing. This prevents the resist film on the peripheral edge of the substrate W from being stripped to be particles when the peripheral edge of the substrate W contacts the other portion after the development processing.

The edge exposure unit EEW thus has a function of detecting a state of the peripheral edge of the substrate W while having a function of performing edge exposure processing for the substrate W, which can prevent the substrate processing apparatus 100 from increasing in size and footprint.

The washing/drying processing section 162 includes a plurality of (five in this example) washing/drying processing units SD2. In the washing/drying processing unit SD2, the substrate W after exposure processing is subjected to washing and drying processing.

(4) Configuration of Transport Section (4-1) Schematic Configuration

Figure 5:
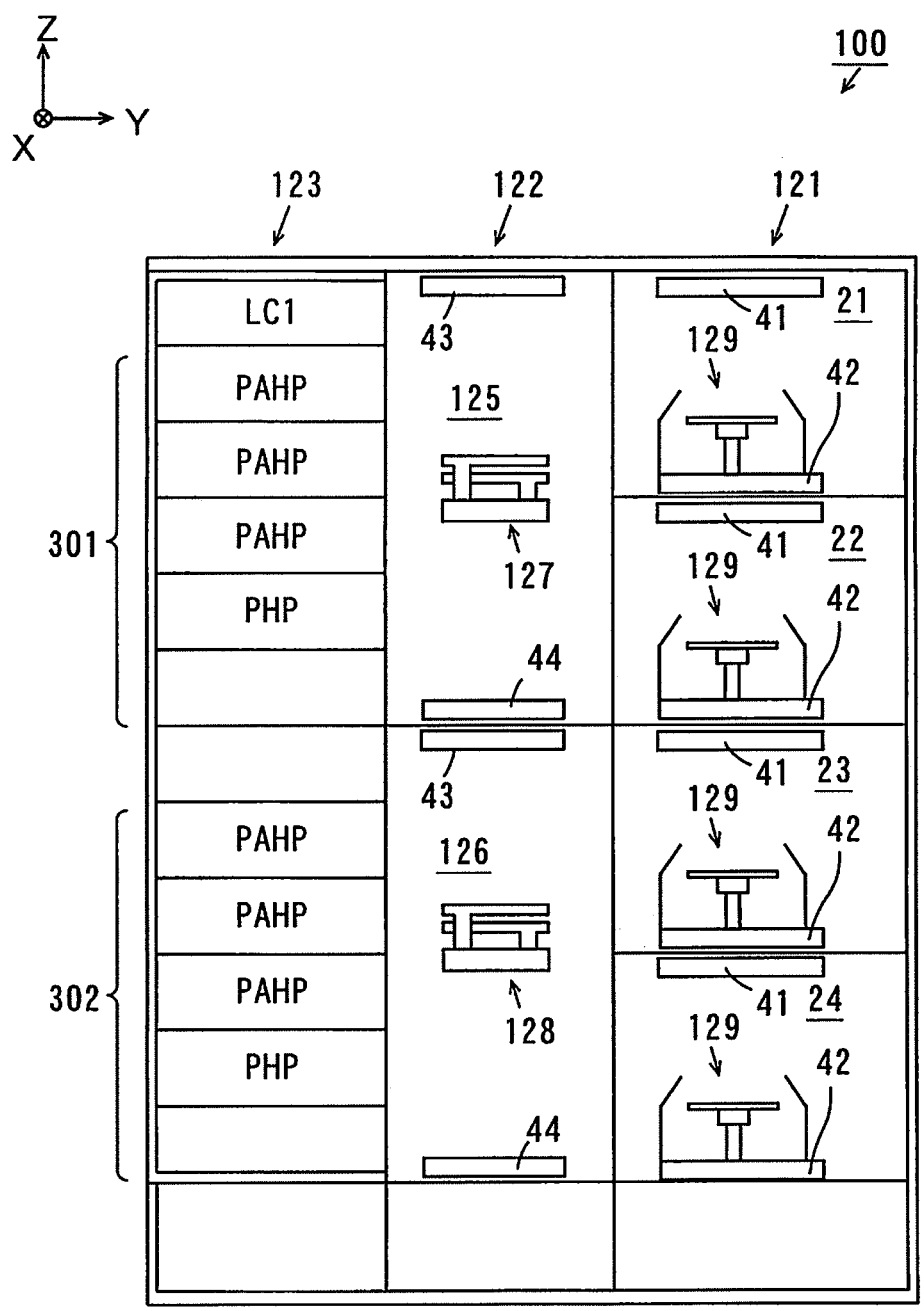
FIG. 5 illustrates a coating processing section, a transport section, and a thermal processing section illustrated in FIG. 1 as viewed in a −X-direction.

FIG. 5 illustrates the coating processing section 121, the transport section 122, and the thermal processing section 123 illustrated in FIG. 1 as viewed in a −X-direction. FIG. 6 illustrates the transport sections 122, 132, and 163 as viewed in the −Y-direction.

As illustrated in FIGS. 5 and 6, the transport section 122 includes an upper transport chamber 125 and a lower transport chamber 126. The transport section 132 includes an upper transport chamber 135 and a lower transport chamber 136. The upper transport chamber 125 includes a transport mechanism 127, and the lower transport chamber 126 includes a transport mechanism 128. The upper transport chamber 135 includes the transport mechanism 137, and the lower transport chamber 136 includes the transport mechanism 138.

As illustrated in FIG. 5, the coating processing chambers 21 and 22 are opposed to the upper thermal processing section 301 with the upper transport chamber 125 sandwiched therebetween, and the coating processing chambers 23 and 24 are opposed to the lower thermal processing section 302 with the lower transport chamber 126 sandwiched therebetween. Similarly, the development processing chamber 31 and the coating processing chamber 32 (FIG. 2) are opposed to the upper thermal processing section 303 (FIG. 4) with the upper transport chamber 135 (FIG. 6) sandwiched therebetween, and the development processing chamber 33 and the coating processing chamber 34 (FIG. 2) are opposed to the lower thermal processing section 304 (FIG. 4) with the lower transport chamber 136 (FIG. 6) sandwiched therebetween.

As illustrated in FIG. 6, the substrate platforms PASS1 and PASS2 are provided between the transport section 112 and the upper transport chamber 125, and the substrate platforms PASS3 and PASS4 are provided between the transport section 112 and the lower transport chamber 126. The substrate platforms PASS5 and PASS6 are provided between the upper transport chamber 125 and the upper transport chamber 135, and the substrate platforms PASS7 and PASS8 are provided between the lower transport chamber 126 and the lower transport chamber 136.

The placement/buffer section P-BF1 is provided between the upper transport chamber 135 and the transport section 163, and the placement/buffer section P-BF2 is provided between the lower transport chamber 136 and the transport section 163. The substrate platform PASS9 and the plurality of placement/cooling sections P-CP are provided adjacent to the carry-in/carry-out block 14B in the transport section 163.

The transport mechanism 137 and the transport mechanisms 141 and 142 (FIG. 1) can carry the substrates W into and out of the placement/buffer section P-BF1. The transport mechanism 138 and the transport mechanisms 141 and 142 (FIG. 1) can carry the substrates W into and out of the placement/buffer section P-BF2. The transport mechanisms 141 and 142 (FIG. 1) and the transport mechanism 146 can carry the substrates W into and out of the substrate platform PASS9 and the placement/cooling sections P-CP.

While only one substrate platform PASS9 is provided in the example illustrated in FIG. 6, a plurality of substrate platforms PASS9 may be provided one above the other. In this case, a plurality of substrate platforms PASS9 may be used as a buffer on which the substrates W are to be temporarily placed.

In the present embodiment, the substrates W to be transported from the indexer block 11 to the first processing block 12 are placed on the substrate platforms PASS1 and PASS3, and the substrates W to be transported from the first processing block 12 to the indexer block 11 is placed on the substrate platforms PASS2 and PASS4.

The substrates W to be transported from the first processing block 12 to the second processing block 13 are placed on the substrate platforms PASS5 and PASS7, and the substrates W to be transported from the second processing block 13 to the first processing block 12 are placed on the substrate platforms PASS6 and PASS8.

The substrates W to be transported from the second processing block 13 to the washing/drying processing block 14A are placed on the placement/buffer sections P-BF1 and P-BF2, the substrates W to be transported from the washing/drying processing block 14A to the carry-in/carry-out block 14B are placed on the placement/cooling sections P-CP, and the substrates W to be transported from the carry-in/carry-out block 14B to the washing/drying processing block 14A are placed on the substrate platform PASS9.

Air supply units 43 are respectively provided above the transport mechanism 127 in the upper transport chamber 125 and the transport mechanism 128 in the lower transport chamber 126. Air supply units 43 are respectively provided above the transport mechanism 137 in the upper transport chamber 135 and the transport mechanism 138 in the lower transport chamber 136. Air, the temperature and humidity of which have been regulated, is supplied to the air supply unit 43 from a temperature regulation device (not illustrated).

An exhaust unit 44 for exhausting the upper transport chamber 125 is provided below the transport mechanism 127 in the upper transport chamber 125, and an exhaust unit 44 for exhausting the lower transport chamber 126 is provided below the transport mechanism 128 in the lower transport chamber 126.

Similarly, an exhaust unit 44 for exhausting the upper transport chamber 135 is provided below the transport mechanism 137 in the upper transport chamber 135, and an exhaust unit 44 for exhausting the lower transport chamber 136 is provided below the transport mechanism 138 in the lower transport chamber 136.

Thus, atmospheres in the upper transport chambers 125 and 135 and the lower transport chambers 126 and 136 are respectively maintained at appropriate temperatures and humidifies and in clean states.

An air supply unit 45 is provided in an upper part of the transport section 163 in the washing/drying processing block 14A. An air supply unit 46 is provided in an upper part of the carry-in/carry-out block 14B. Air, the temperature and humidity of which have been regulated, is supplied to the air supply units 45 and 46 from a temperature regulation device (not illustrated). Thus, atmospheres in the washing/drying processing block 14A and the carry-in/carry-out block 14B are respectively maintained at appropriate temperatures and humidities and in clean states.

(4-2) Configuration of Transport Mechanism

Figure 7:
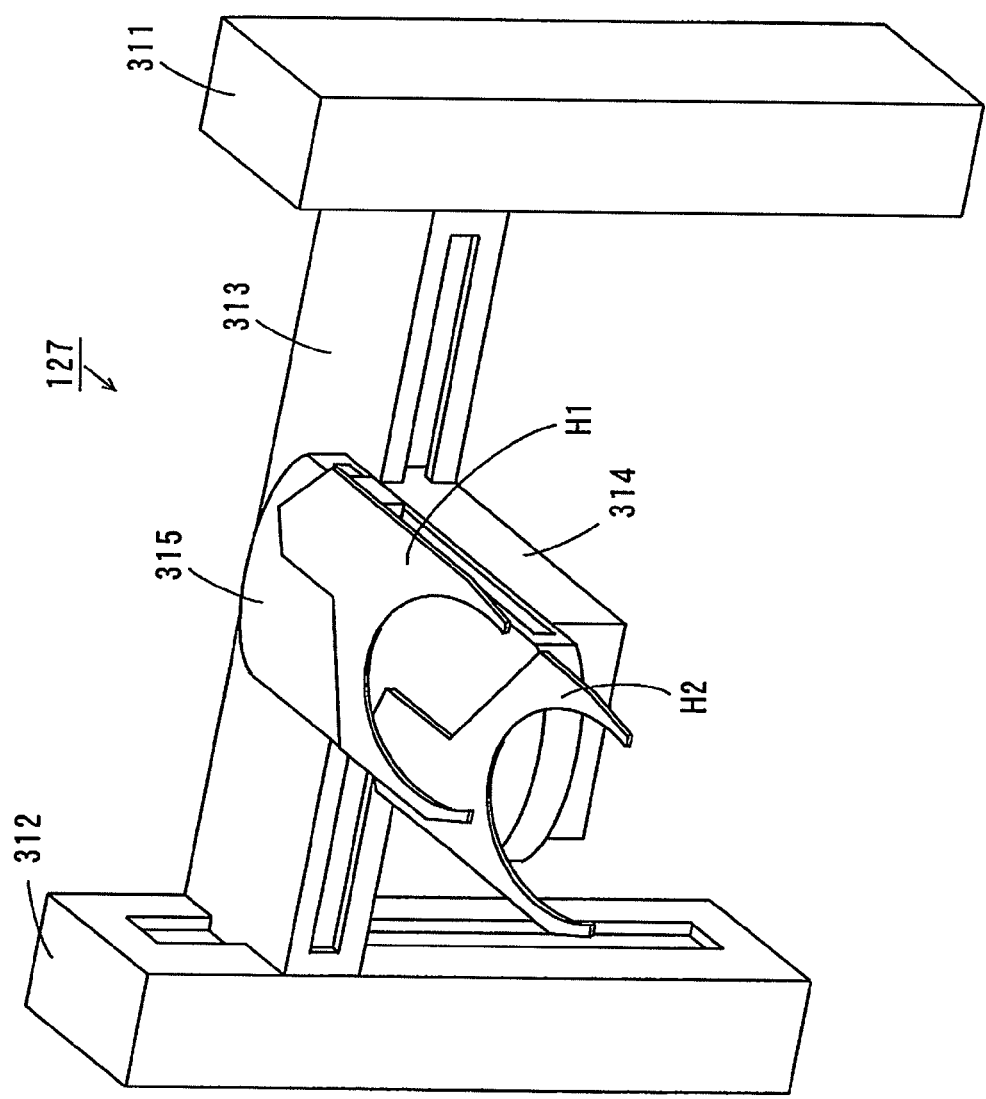
FIG. 7 is a perspective view illustrating a transport mechanism.

The transport mechanism 127 will be described below. FIG. 7 is a perspective view illustrating the transport mechanism 127.

As illustrated in FIGS. 6 and 7, the transport mechanism 127 includes long-sized guide rails 311 and 312. As illustrated in FIG. 6, the guide rail 311 is fixed close to the transport section 112 to extend in the vertical direction in the upper transport chamber 125. The guide rail 312 is fixed close to the upper transport chamber 135 to extend in the vertical direction in the upper transport chamber 125.

As illustrated in FIGS. 6 and 7, a long-sized guide rail 313 is provided between the guide rail 311 and the guide rail 312. The guide rail 313 is attached to the guide rails 311 and 312 to be movable up and down. A moving member 314 is attached to the guide rail 313. The moving member 314 is movable in a longitudinal direction of the guide rail 313.

A long-sized rotating member 315 is rotatably provided on an upper surface of the moving member 314. Hands H1 and H2 for holding the substrates W are attached to the rotating member 315. The hands H1 and H2 are movable in a longitudinal direction of the rotating member 315.

The above-mentioned configuration enables the transport mechanism 127 to freely move in the X-direction and the Z-direction in the upper transport chamber 125. The substrate W can be transferred and received to and from the coating processing chambers 21 and 22 (FIG. 2), the substrate platforms PASS1, PASS2, PASS5, and PASS6 (FIG. 6), and the upper thermal processing section 301 (FIG. 4) using the hands H1 and H2.

As illustrated in FIG. 6, the transport mechanisms 128, 137, and 138 have a similar configuration to that of the transport mechanism 127.

(5) Configuration of Washing/Drying Processing Block

Figure 8:
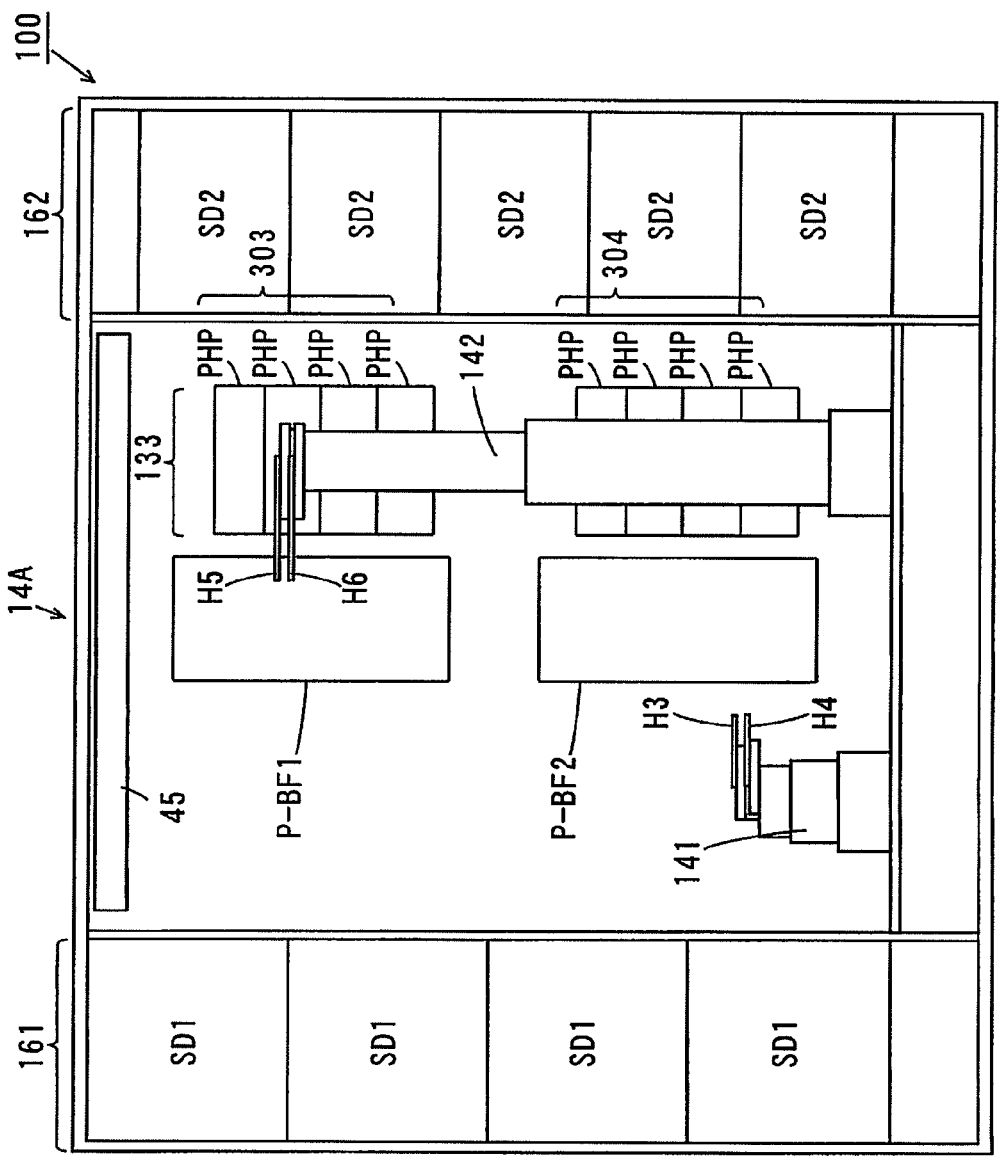
FIG. 8 illustrates an internal configuration of a washing/drying processing block.

FIG. 8 illustrates an internal configuration of the washing/drying processing block 14A. FIG. 8 illustrates the washing/drying processing block 14A as viewed in a +X-direction.

As illustrated in FIG. 8, the transport mechanism 141 has hands H3 and H4 for holding the substrates W, and the transport mechanism 142 has hands H5 and H6 for holding the substrates W.

The washing/drying processing units SD1 are hierarchically provided on the +Y side of the transport mechanism 141, and the washing/drying processing units SD2 are hierarchically provided on the −Y side of the transport mechanism 142. Between the transport mechanisms 141 and 142, the placement/buffer sections P-BF1 and P-BF2 are provided one above the other on the −X side.

The substrates W from the washing/drying processing block 14A can be carried into and out of the thermal processing units PHP in the upper thermal processing section 303 and the lower thermal processing section 304.

(6) Operation of Each Constituent Element in Substrate Processing Apparatus

An operation of each of constituent elements in the substrate processing apparatus 100 according to the present embodiment will be described below.

(6-1) Operation of Indexer Block 11

An operation of the indexer block 11 will be described below mainly with reference to FIGS. 1 and 6.

In the substrate processing apparatus 100 according to the present embodiment, a carrier 113 that stores unprocessed substrates W is placed on the carrier platform 111 in the indexer block 11. The transport mechanism 115 takes out one of the substrates W from the carrier 113, and transports the substrate W to the substrate platform PASS1. The transport mechanism 115 then takes out the other one unprocessed substrate W from the carrier 113, and transports the substrate W to the substrate platform PASS3 (FIG. 6).

If the processed substrate W is placed on the substrate platform PASS2 (FIG. 6), the transport mechanism 115 takes out the processed substrate W from the substrate platform PASS2 after transporting the unprocessed substrate W to the substrate platform PASS1. The transport mechanism 115 transports the processed substrate W to the carrier 113. Similarly, if the processed substrate W is placed on the substrate platform PASS4, the transport mechanism 115 takes out the processed substrate W from the substrate platform PASS4 after transporting the unprocessed substrate W to the substrate platform PASS3. The transport mechanism 115 transports the processed substrate W to the carrier 113 while storing the substrate W in the carrier 113.

(6-2) Operation of First Processing Block 12

An operation of the first processing block 12 will be described below mainly with reference to FIGS. 1, 2, 4, and 6. For convenience, description of movements in the X-direction and the Z-direction of the transport mechanisms 127 and 128 is omitted.

The substrate W placed on the substrate platform PASS1 (FIG. 6) by the transport mechanism 115 (FIG. 6) is taken out with the hand H1 of the transport mechanism 127 (FIG. 6). The transport mechanism 127 places the substrate W, which is held in the hand H2, on the substrate platform PASS2. The substrate W placed on the substrate platform PASS2 from the hand H2 is the substrate W after development processing.

The transport mechanism 127 then takes out the substrate W after adhesion reinforcement processing from the predetermined adhesion reinforcement processing unit PAHP (FIG. 4) in the upper thermal processing section 301 (FIG. 4) with the hand H2. The transport mechanism 127 carries the unprocessed substrate W, which is held in the hand H1, into the adhesion reinforcement processing unit PAHP.

The transport mechanism 127 then takes out the substrate W after cooling processing from the predetermined cooling unit CP in the upper thermal processing section 301 (FIG. 4) with the hand H1. The transport mechanism 127 carries the substrate W after adhesion reinforcement processing, which is held in the hand H2, into the cooling unit CP. The cooling unit CP cools the substrate W to a temperature suitable for anti-reflection film formation.

The transport mechanism 127 then takes out the substrate W after anti-reflection film formation from above the spin chuck 25 (FIG. 2) in the coating processing chamber 22 (FIG. 2) with the hand H2. The transport mechanism 127 places the substrate W after cooling processing, which is held in the hand H1, on the spin chuck 25. In the coating processing chamber 22, the coating processing unit 129 (FIG. 2) forms an anti-reflection film on the substrate W.

The transport mechanism 127 then takes out the substrate W after heating processing from the predetermined thermal processing unit PHP in the upper thermal processing section 301 (FIG. 4) with the hand H1. The transport mechanism 127 carries the substrate W after anti-reflection film formation, which is held in the hand H2, into the thermal processing unit PHP. In the thermal processing unit PHP, the substrate W is continuously subjected to heating processing and cooling processing.

The transport mechanism 127 then takes out the substrate W after cooling processing from the predetermined cooling unit CP (FIG. 4) in the upper thermal processing section 301 (FIG. 5) with the hand H2. The transport mechanism 127 carries the substrate W after heating processing, which is held in the hand H1, into the cooling unit CP. In the cooling unit CP, the substrate W is cooled to a temperature suitable for resist film formation processing.

The transport mechanism 127 then takes out the substrate W after resist film formation from the spin chuck 25 (FIG. 2) in the coating processing chamber 21 (FIG. 2) with the hand H1. The transport mechanism 127 places the substrate W after cooling processing, which is held in the hand H2, on the spin chuck 25. In the coating processing chamber 22, the coating processing unit 129 (FIG. 2) forms a resist film on the substrate W.

The transport mechanism 127 then takes out the substrate W after heating processing from the predetermined thermal processing unit PHP in the upper thermal processing section 301 (FIG. 4) with the hand H2. The transport mechanism 127 carries the substrate W after resist film formation, which is held in the hand H1, into the thermal processing unit PHP.

The transport mechanism 127 then places the substrate W after heating processing, which is held in the hand H2, on the substrate platform PASS5 (FIG. 6). The transport mechanism 127 takes out the substrate W after development processing from the substrate platform PASS6 (FIG. 6) with the hand H2. The transport mechanism 127 then transports the substrate W after development processing, which has been taken out of the substrate platform PASS6, into the substrate platform PASS2 (FIG. 6).

The transport mechanism 127 repeats the above-mentioned processing so that the plurality of substrates W are continuously subjected to predetermined processing in the first processing block 12.

The transport mechanism 128 carries the substrate W into and out of the substrate platforms PASS3, PASS4, PASS7, and PASS8 (FIG. 6), the coating processing chambers 23 and 24 (FIG. 2), and the lower thermal processing section 302 (FIG. 5) by a similar operation to that of the transport mechanism 127.

Thus, in the present embodiment, the substrate W, which is transported by the transport mechanism 127, is processed in the coating processing chambers 21 and 22 and the upper thermal processing section 301, and the substrate W, which is transported by the transport mechanism 128, is processed in the coating processing chambers 23 and 24 and the lower thermal processing section 302. In this case, the plurality of substrates W can be simultaneously processed in an upper processing section (the coating processing chambers 21 and 22 and the upper thermal processing section 301) and a lower processing section (the coating processing chambers 23 and 24 and the lower thermal processing section 302). This enables the throughput of the first processing block 12 to be improved without increasing the transport speed of the substrate W by the transport mechanisms 127 and 128. The transport mechanisms 127 and 128 are provided one above the other so that the footprint of the substrate processing apparatus 100 can be prevented from increasing.

While the substrate W is subjected to cooling processing in the cooling unit CP before the anti-reflection film is formed in the coating processing chamber 22 in the above-mentioned example, the substrate W need not be subjected to cooling processing in the cooling unit CP to form the anti-reflection film if the anti-reflection film can be appropriately formed.

(6-3) Operation of Second Processing Block 13

An operation of the second processing block 13 will be described below mainly with reference to FIGS. 1, 2, 4, and 6. For convenience, description of movements in the X-direction and the Z-direction of the transport mechanisms 137 and 138 is omitted.

The substrate W placed on the substrate platform PASS5 (FIG. 6) by the transport mechanism 127 (FIG. 6) is taken out with the hand H1 of the transport mechanism 137 (FIG. 6). The transport mechanism 137 places the substrate W, which is held in the hand H2, on the substrate platform PASS6. The substrate W placed on the substrate platform PASS6 from the hand H2 is the substrate after development processing.

The transport mechanism 137 then takes out the substrate W after resist cover film formation from the spin chuck 25 (FIG. 2) in the coating processing chamber 32 (FIG. 2) with the hand H2. The transport mechanism 137 places the substrate W after resist film formation, which is held in the hand H1, on the spin chuck 25. In the coating processing chamber 32, the coating processing unit 129 (FIG. 2) forms a resist cover film on the substrate W.

The transport mechanism 137 then takes out the substrate W after heating processing from the predetermined thermal processing unit PHP in the upper thermal processing section 303 (FIG. 4) with the hand H1. The transport mechanism 137 carries the substrate W after resist cover film formation, which is held in the hand H2, into the thermal processing unit PHP.

The transport mechanism 137 then takes out the substrate W after edge exposure processing from the edge exposure unit EEW (FIG. 4) with the hand H2. The transport mechanism 137 carries the substrate W after heating processing, which is held in the hand H1, into the edge exposure unit EEW.

The transport mechanism 137 places the substrate W after edge exposure processing, which is held in the hand H2, on the placement/buffer section P-BF1 (FIG. 6) while taking out the substrate W after heating processing from the thermal processing unit PHP in the upper thermal processing section 301 (FIG. 5) adjacent to the carry-in/carry-out block 14B with the hand H2. The substrate, which is taken out of the thermal processing unit PHP adjacent to the carry-in/carry-out block 14B, has already been subjected to exposure processing in the exposure device 15.

The transport mechanism 137 then takes out the substrate W after cooling processing from the predetermined cooling unit CP (FIG. 4) in the upper thermal processing section 303 (FIG. 4) with the hand H1. The transport mechanism 137 carries the substrate W after exposure processing, which is held in the hand H2, into the cooling unit CP. In the cooling unit CP, the substrate W is cooled to a temperature suitable for development processing.

The transport mechanism 137 then takes out the substrate W after development processing from the spin chuck 35 (FIG. 2) in the development processing chamber 31 (FIG. 2) with the hand H2. The transport mechanism 137 places the substrate W after cooling processing, which is held in the hand H1, on the spin chuck 35. In the development processing chamber 31, the development processing unit 139 subjects a resist cover film to removal processing and development processing.

The transport mechanism 137 then takes out the substrate W after heating processing from the predetermined thermal processing unit PHP in the upper thermal processing section 303 (FIG. 4) with the hand H1. The transport mechanism 137 carries the substrate W after development processing, which is held in the hand H2, into the thermal processing unit PHP. The transport mechanism 137 then places the substrate W, which has been taken out of the thermal processing unit PHP, on the substrate platform PASS6 (FIG. 6).

The transport mechanism 137 repeats the above-mentioned processing so that the plurality of substrates W are continuously subjected to the predetermined processing in the second processing block 13.

The transport mechanism 138 carries the substrate W into and out of the substrate platforms PASS7 and PASS8, the placement/buffer section P-BF2 (FIG. 6), the development processing chamber 33 (FIG. 2), the coating processing chamber 34 (FIG. 2), and the lower thermal processing section 304 (FIG. 4) by a similar operation to that of the transport mechanism 137.

In the present embodiment, the substrate W, which is transported by the transport mechanism 137, is processed in the development processing chamber 31, the coating processing chamber 32, and the upper thermal processing section 303, and the substrate W, which is transported by the transport mechanism 138, is processed in the development processing chamber 33, the coating processing chamber 34, and the lower thermal processing section 304. In this case, the plurality of substrates W can be simultaneously processed in an upper processing section (the development processing chamber 31, the coating processing chamber 32, and the upper thermal processing section 303) and a lower processing section (the development processing chamber 33, the coating processing chamber 34, and the lower thermal processing section 304). This enables the throughput of the second processing block 13 to be improved without increasing the transport speed of the substrate W by the transport mechanisms 137 and 138. The transport mechanisms 137 and 138 are provided one above the other so that the footprint of the substrate processing apparatus 100 can be prevented from increasing.

While the substrate W is subjected to cooling processing in the cooling unit CP before being subjected to development processing in the development processing chamber 31 in the above-mentioned example, the substrate W need not be subjected to cooling processing in the cooling unit CP before development processing if the development processing can be appropriately performed.

(6-4) Operation of Washing/Dying Processing Block 14A and Carry-in/Carry-out Block 14B Operations of the washing/drying processing block 14A and the carry-in/carry-out block 14B will be described below mainly with reference to FIGS. 6 and 8.

In the washing/drying processing block 14A, the transport mechanism 141 (FIG. 8) takes out the substrate W after edge exposure, which has been placed on the placement/buffer section P-BF1 by the transport mechanism 137 (FIG. 6), with the hand H3.

The transport mechanism 141 then takes out the substrate W after washing and drying processing from the predetermined washing/drying processing unit SD1 in the washing/drying processing section 161 (FIG. 8) with the hand H4. The transport mechanism 141 carries the substrate W after edge exposure, which is held in the hand H3, into the washing/drying processing unit SD1.

The transport mechanism 141 then places the substrate W after washing and drying processing, which is held in the hand H4, on the placement/cooling section P-CP (FIG. 6). The placement/cooling section P-CP cools the substrate W to a temperature suitable for exposure processing in the exposure device 15 (FIG. 1).

The transport mechanism 141 then takes out the substrate W after edge exposure processing, which has been placed on the placement/buffer section P-BF2 by the transport mechanism 138 (FIG. 6), with the hand H3. The transport mechanism 141 takes out the substrate W after washing and drying processing from the predetermined washing/drying processing unit SD1 in the washing/drying processing section 161 (FIG. 8) with the hand H4. The transport mechanism 141 carries the substrate W after edge exposure, which is held in the hand H3, into the washing/drying processing unit SD1. The transport mechanism 141 then places the substrate W after washing and drying processing, which is held in the hand H4, on the placement/cooling section P-CP (FIG. 6).

Thus, the transport mechanism 141 alternately transports the substrate W after edge exposure, which has been placed on the placement/buffer sections P-BF1 and P-FB2, to the placement/cooling section P-CP via the washing/drying processing section 161.

The transport mechanism 115 (FIG. 6) alternately transports the substrate W, which is stored in the carrier 113 (FIG. 6), to the substrate platforms PASS1 and PASS3 (FIG. 6). The processing speed of the substrate W in the coating processing chambers 21 and 22 (FIG. 2) and the upper thermal processing section 301 (FIG. 4) is substantially equal to the processing speed of the substrate W in the coating processing chambers 23 and 24 (FIG. 2) and the lower thermal processing section 302 (FIG. 4).

The operation speed of the transport mechanism 127 (FIG. 6) is substantially equal to the operation speed of the transport mechanism 128 (FIG. 6). The processing speed of the substrate W in the development processing chamber 31 (FIG. 2), the coating processing chamber 32 (FIG. 2), and the upper thermal processing section 303 (FIG. 4) is substantially equal to the processing speed of the substrate W in the development processing chamber 33 (FIG. 2), the coating processing chamber 34 (FIG. 2), and the lower thermal processing section 304 (FIG. 4). The operation speed of the transport mechanism 137 (FIG. 6) is substantially equal to the operation speed of the transport mechanism 138 (FIG. 6).

Therefore, the transport mechanism 141 (FIG. 8) alternately transports the substrates W to the placement/cooling section P-CP from the placement/buffer sections P-FB1 and P-BF2 (FIG. 6) so that the order of the substrates W that are carried into the substrate processing apparatus 100 from the carrier 113 and the order of the substrates W that are transported to the placement/cooling section P-CP (FIG. 6) from the washing/drying processing block 14A match each other, as described above. In this case, a processing history of each of the substrates W in the substrate processing apparatus 100 becomes easy to manage.

The transport mechanism 142 (FIG. 8) takes out the substrate W after exposure processing, which has been placed on the substrate platform PASS9 (FIG. 6), with the hand H5. The transport mechanism 142 then takes out the substrate W after washing and drying processing from the predetermined washing/drying processing unit SD2 in the washing/drying processing section 162 (FIG. 8) with the hand H6. The transport mechanism 142 carries the substrate W after exposure processing, which is held in the hand H5, into the washing/drying processing unit SD2.

The transport mechanism 142 then transports the substrate W after washing and drying processing, which is held in the hand H6, to the thermal processing unit PHP (FIG. 8) in the upper thermal processing section 303. In the thermal processing unit PHP, post exposure bake (PEB) processing is performed.

The transport mechanism 142 (FIG. 8) then takes out the substrate W after exposure processing, which has been placed on the substrate platform PASS9 (FIG. 6), with the hand H5. The transport mechanism 142 then takes out the substrate W after washing and drying processing from the predetermined washing/drying processing unit SD2 in the washing/drying processing section 162 (FIG. 8) with the hand H6. The transport mechanism 142 carries the substrate W after exposure processing, which is held in the hand H5, into the washing/drying processing unit SD2.

The transport mechanism 142 then transports the substrate W after washing and drying processing, which is held in the hand H6, to the thermal processing unit PHP (FIG. 8) in the lower thermal processing section 304. In this thermal processing unit PHP, PEB processing is performed.

Thus, the transport mechanism 142 alternately transports the substrate W after exposure processing, which has been placed on the substrate platform PASS9, to the upper thermal processing section 303 and the lower thermal processing section 304 via the washing/drying processing section 162.

In the carry-in/carry-out block 14B, the transport mechanism 146 (FIG. 6) takes out the substrate W, which has been placed on the placement/cooling section P-CP, with the hand H7, and transports the substrate W to the substrate carry-in section 15a in the exposure device 15. The transport mechanism 146 takes out the substrate W after exposure processing from the substrate carry-out section 15b in the exposure device 15, and transports the substrate W to the substrate platform PASS9.

As described above, the order of the substrates W placed on the placement/cooling section P-CP (FIG. 6) by the transport mechanism 141 (FIG. 8) is equal to the order of the substrates W carried into the substrate processing apparatus 100 from the carrier 113 (FIG. 6). This enables the order of the substrates W carried into the substrate processing apparatus 100 from the carrier 113 and the order of the substrates W carried into the exposure device 15 by the transport mechanism 142 (FIG. 8) to match each other. Thus, a processing history of each of substrates W in the exposure device 15 becomes easy to manage. This can prevent a state of exposure processing to vary among the plurality of substrates W carried into the substrate processing apparatus 100 from the carrier 113.

When the exposure device 15 cannot receive the substrate W, the transport mechanism 141 (FIG. 8) temporarily stores the substrate W after washing and drying processing in the placement/buffer sections P-BF1 and P-BF2.

When the development processing unit 139 (FIG. 2) in the second processing block 13 cannot receive the substrate W after exposure processing, the transport mechanisms 137 and 138 (FIG. 6) temporarily stores the substrate W after PEB processing in the placement/buffer sections P-BF1 and P-BF2.

When the substrates W are not normally transported to the placement/buffer sections P-BF1 and P-BF2 due to malfunctions of the first and second processing blocks 12 and 13, the transport of the substrates W from the placement/buffer sections P-BF1 and P-BF2 by the transport mechanism 141 may be temporarily stopped until the substrates W are normally transported.

(7) Coating Processing Unit

Figure 9:
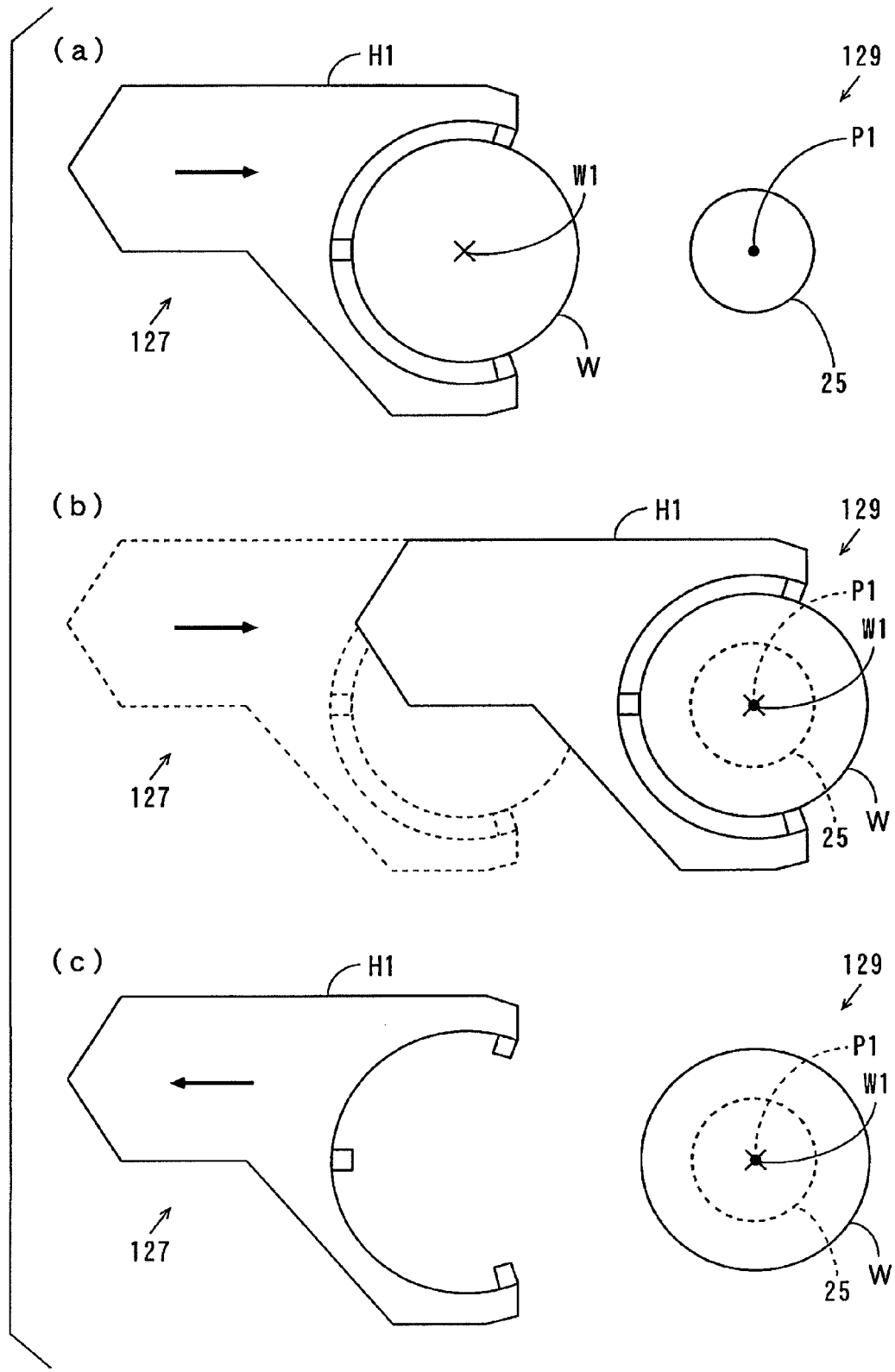
FIGS. 9 (a) to 9 (c) illustrate an operation of a hand of the transport mechanism illustrated in FIG. 7 when a substrate is carried into the coating processing unit illustrated in FIG. 3.

FIG. 9 illustrates an operation of the hand H1 of the transport mechanism 127 illustrated in FIG. 7 when the substrate W is carried into the coating processing unit 129 illustrated in FIG. 3. In FIG. 9, a part of a configuration of the transport mechanism 127 and the coating processing unit 129 is illustrated by a top view. An operation of the hand H2 of the transport mechanism 127 is similar to an operation of the hand H1 thereof. Further, operations of the hands H1 and the H2 of each of the transport mechanisms 128, 137, and 138 illustrated in FIG. 6 are similar to operations of the hands H1 and H2 of the transport mechanism 127.

The substrate W, which has been held in the hand H1, is carried into the coating processing unit 129, as indicated by an arrow in FIG. 9 (a). A positional relationship between the hand H1 and the spin chuck 25 is previously set. Then, the substrate W, which has been carried into the coating processing unit 129, is placed on the spin chuck 25 so that the center W1 of the substrate W matches an axis P1 of the spin chuck 25, as illustrated in FIG. 9 (b). Then, the hand H1 is carried out of the coating processing unit 129, as illustrated in FIG. 9 (c).

In the coating processing unit 129 in each of the coating processing chambers 22 and 24 (FIG. 2), an anti-reflection liquid is applied onto a surface of the substrate W. In the coating processing unit 129 in each of the coating processing chambers 21 and 23 (FIG. 2), a resist liquid is applied onto an anti-reflection film formed on the substrate W. In the coating processing unit 129 in each of the coating processing chambers 32 and 34 (FIG. 2), a resist cover liquid is applied onto the resist film formed on the substrate W.

Figure 10:
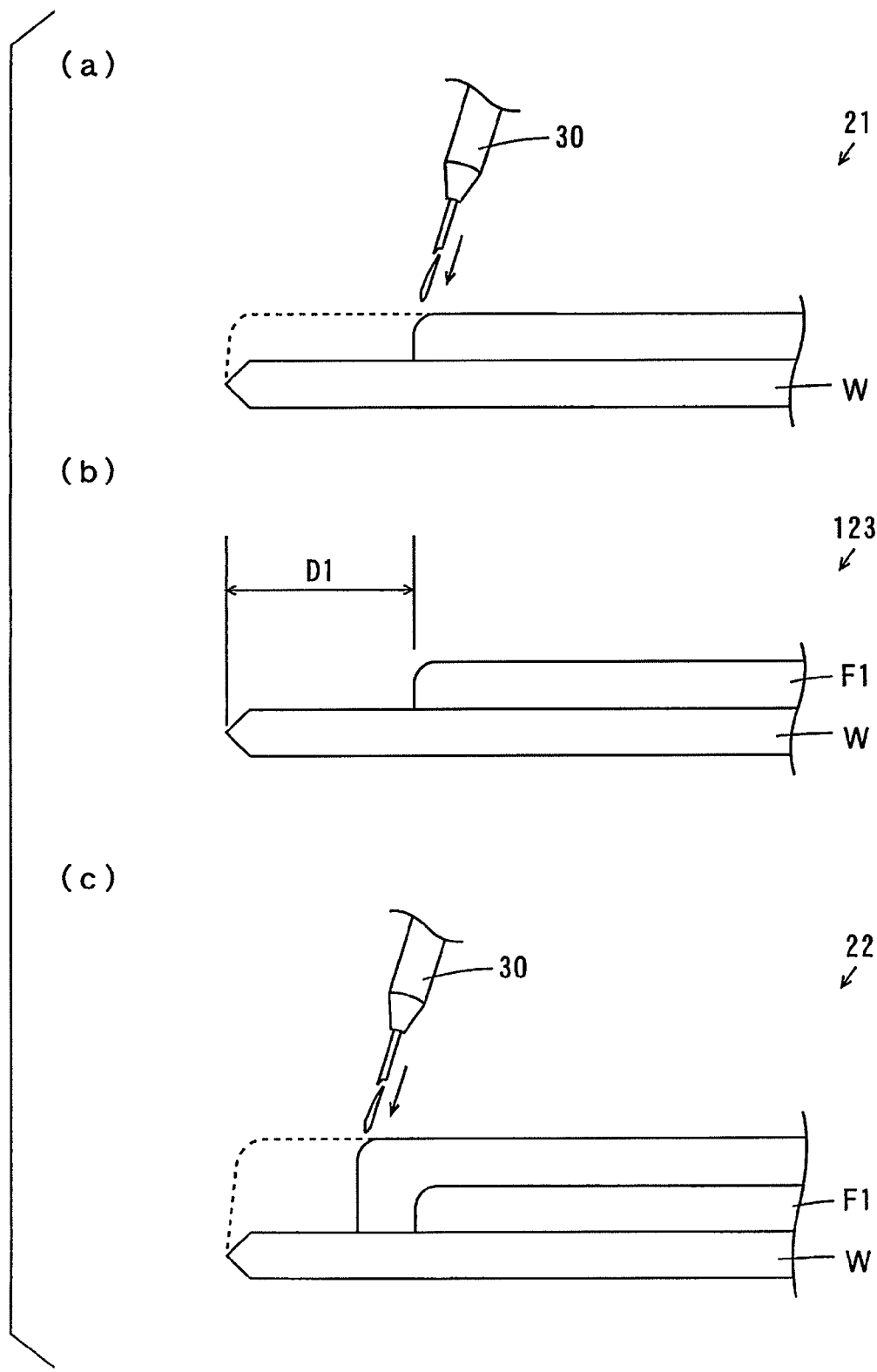
FIGS. 10 (a) to 10 (c) illustrate a procedure for formation of an anti-reflection film, a resist film, and a resist cover film on a surface of a substrate, and a removal range of each of the films.

FIGS. 10 and 11 illustrate a procedure for formation of the anti-reflection film, the resist film, and the resist cover film on a surface of the substrate W and a removal range of each of the films.

First, in the coating processing unit 129 in the coating processing chamber 21 (or the coating processing chamber 23), the anti-reflection liquid is applied onto the surface of the substrate W while the substrate W is rotated, and the rinse liquid is discharged toward the peripheral edge of the substrate W from the edge rinse nozzle 30. Thus, the anti-reflection liquid, which adheres to the peripheral edge of the substrate W, is dissolved, as illustrated in FIG. 10 (a). Thus, the anti-reflection liquid in an annular region at the peripheral edge of the substrate W is removed. Then, an anti-reflection film F1 is formed on the surface of the substrate W excluding the peripheral edge, as illustrated in FIG. 10 (b), when the thermal processing section 123 subjects the substrate W to predetermined heating processing. A width between the outer peripheral portion of the substrate W and an outer peripheral portion of the anti-reflection film F1 is referred to as an edge cut width D1.

Then, in the coating processing unit 129 in the coating processing chamber 22 (or the coating processing chamber 24), the resist liquid is applied onto the surface of the substrate W while the substrate W is rotated, and the rinse liquid is discharged toward the peripheral edge of the substrate W from the edge rinse nozzle 30. Thus, the resist liquid, which adheres to the peripheral edge of the substrate W, is dissolved, as illustrated in FIG. 10 (c). Thus, the resist liquid in the annular region at the peripheral edge of the substrate W is removed. Then, a resist film F2 is formed to cover the anti-reflection film F1 on the substrate W excluding the peripheral edge, as illustrated in FIG. 11 (a), when the thermal processing section 123 subjects the substrate W to predetermined heating processing. A width between the outer peripheral portion of the substrate W and an outer peripheral portion of the resist film F2 is referred to as an edge cut width D2.

Then, in the coating processing unit 129 in the coating processing chamber 32 (or the coating processing chamber 34), the resist cover liquid is applied onto the surface of the substrate W while the substrate W is rotated, and the rinse liquid is discharged toward the peripheral edge of the substrate W from the edge rinse nozzle 30. Thus, the resist cover liquid, which adheres to the peripheral edge of the substrate W, is dissolved, as illustrated in FIG. 11 (b). Thus, the resist cover liquid in the annular region at the peripheral edge of the substrate W is removed. Then, a resist cover film F3 is formed to cover the resist film F2 on the substrate W excluding the peripheral edge, as illustrated in FIG. 11 (c), when the thermal processing section 133 subjects the substrate W to predetermined heating processing. A width between the outer peripheral portion of the substrate W and an outer peripheral portion of the resist cover film F3 is referred to as an edge cut width D3.

Figure 12:
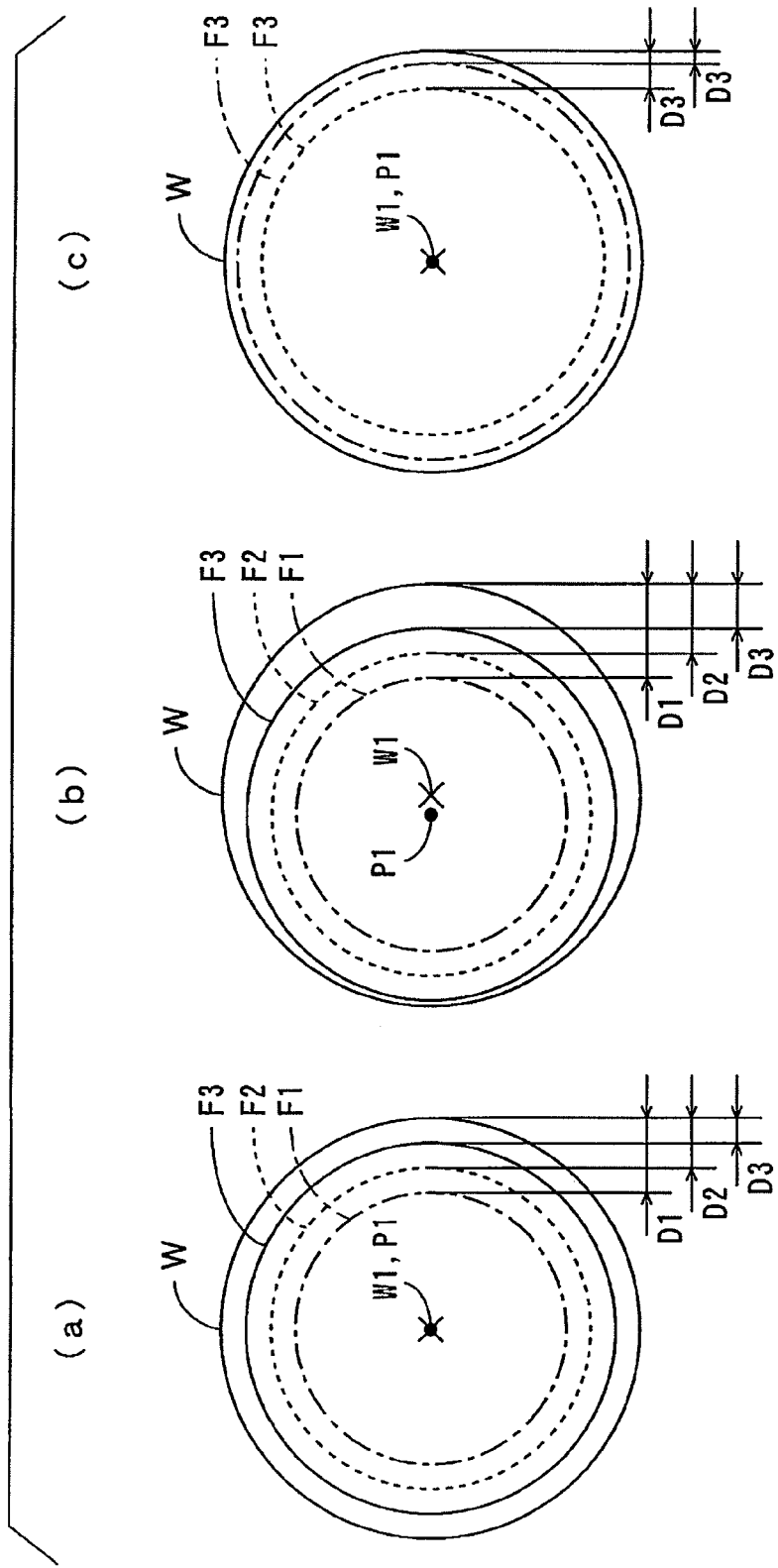
FIGS. 12 (a) to 12 (c) illustrate a plan view of the substrate having the anti-reflection film, the resist film, and the resist cover film formed thereon.

FIG. 12 is a plan view of the substrate W having the anti-reflection film F1, the resist film F2, and the resist cover film F3 formed thereon. In the coating processing unit 129 (FIG. 9), the substrate W is placed on the spin chuck 25 so that the center W1 of the substrate W matches the axis P1 of the spin chuck 25 (FIG. 9). In this state, if the flow rate of the rinse liquid discharged to the substrate W from the edge rinse nozzle 30 and the discharge position of the rinse liquid are appropriate, the anti-reflection film F1, the resist film F2, and the resist cover film F3 are formed over the whole peripheral edge of the substrate W so that each of the edge cut widths D1 to D3 becomes an uniform set value, as illustrated in FIG. 12 (a).

On the other hand, when the center W1 of the substrate W1 is placed on the spin chuck 25 so that the center W1 of the substrate W is eccentric from the axis P1 of the spin chuck 25 in the coating processing unit 129, the anti-reflection film F1, the resist film F2, and the resist cover film F3 are formed on the substrate W so that each of the edge cut widths D1 to D3 becomes non-uniform, as illustrated in FIG. 12 (b).

If the flow rate of the rinse liquid discharged to the substrate W from the edge rinse nozzle 30 is smaller than an appropriate value, the rinse liquid penetrates into a set position. Therefore, the resist cover film F3 is formed so that the edge cut width D3 becomes larger than a set value, as indicated by a dotted line illustrated in FIG. 12 (c). If the flow rate of the rinse liquid discharged to the substrate W from the edge rinse nozzle 30 is larger than the appropriate value, the liquid width of the rinse liquid is narrowed. Therefore, the resist cover film F3 is formed so that the edge cut width D3 becomes smaller than the set value, as indicated by a one-dot and dash line illustrated in FIG. 12 (c). In FIG. 12 (c), illustration of the anti-reflection film F1, the resist film F2, and the edge cut widths D1 and D2 is omitted. In the above-mentioned case, each of the edge cut widths D1 and D2 also differs from a set value.

Further, even if the discharge position of the rinse liquid to the substrate W from the edge rinse nozzle 30 is not appropriate, the anti-reflection film F1, the resist film F2, and the resist cover film F3 are formed so that each of the edge cut widths D1 to D3 differs from the set value.

By thus detecting the edge cut widths D1 to D3 of the substrate W, it can be determined whether an amount of eccentricity of the substrate W in the coating processing unit 129 is an allowable upper-limit value or less or not and whether the flow rate and the discharge position of the rinse liquid are appropriate or not.

(8) Details of Edge Exposure Unit

Figure 13:
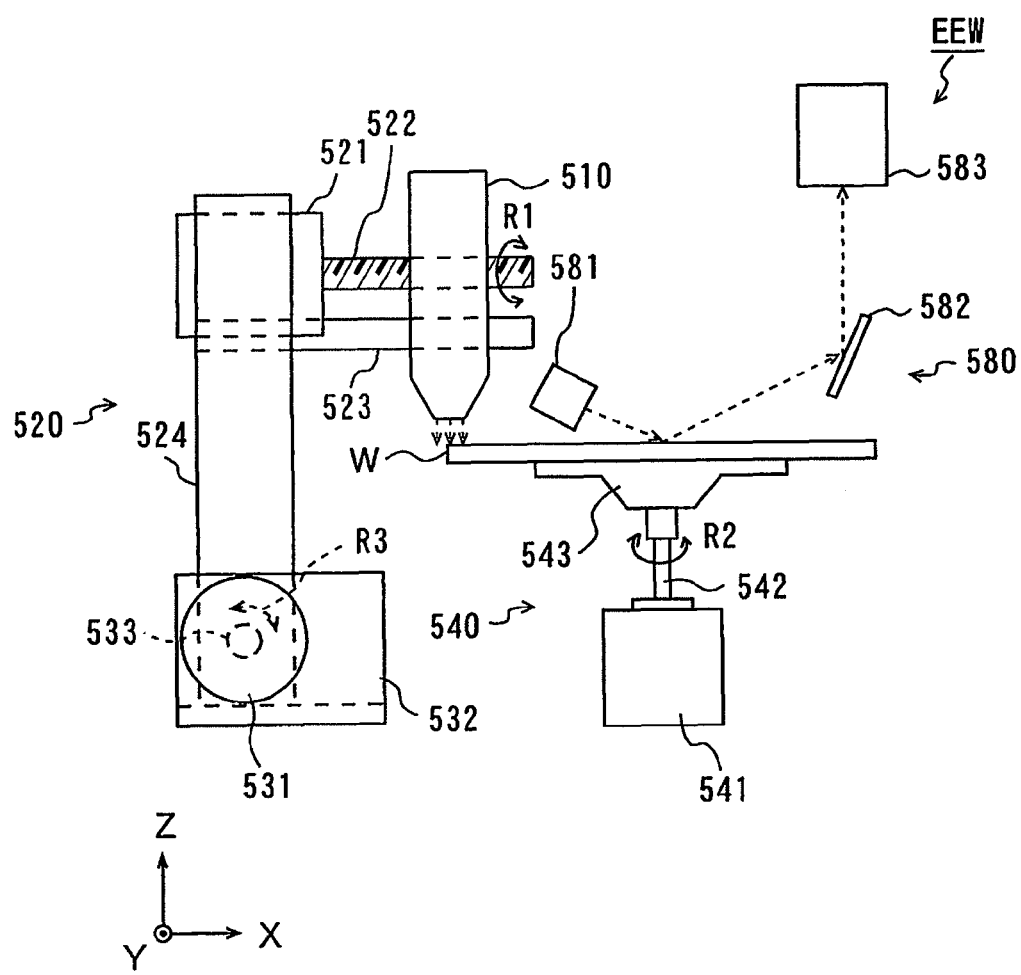
FIG. 13 schematically illustrates one side surface of an edge exposure unit.
Figure 14:
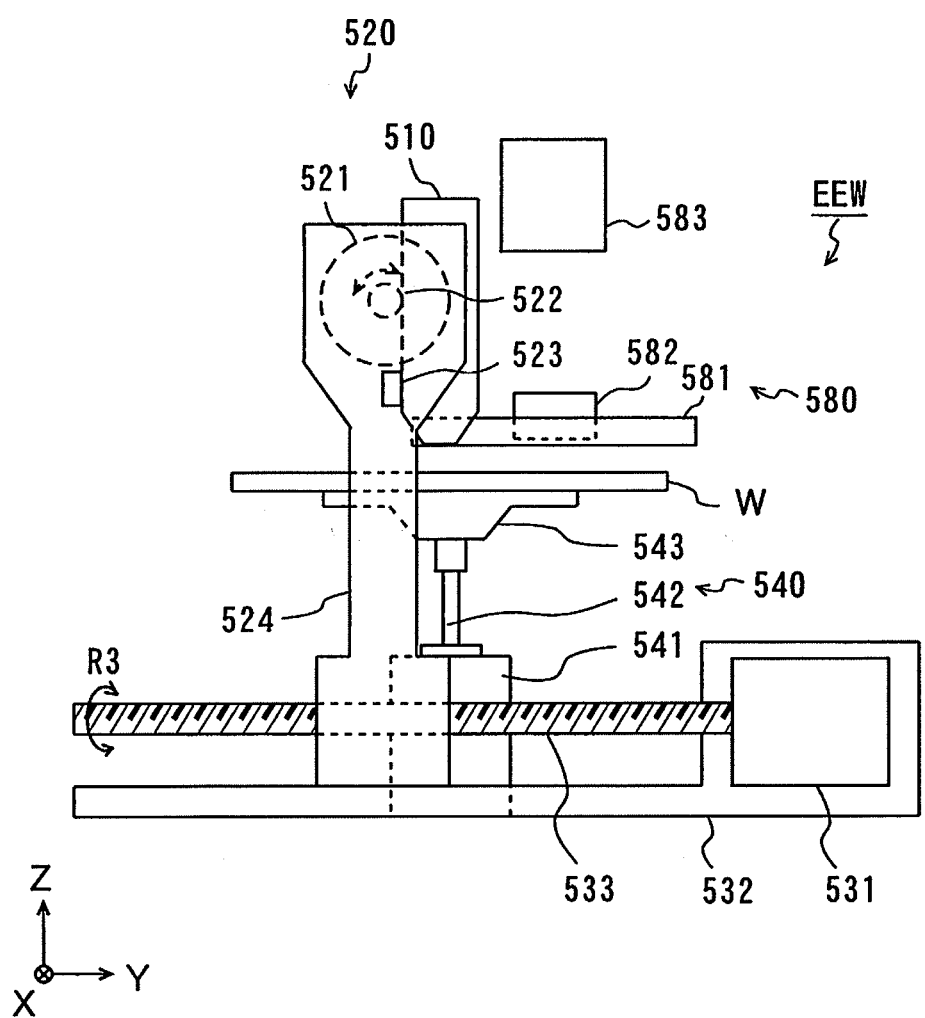
FIG. 14 schematically illustrates another side surface of an edge exposure unit.
Figure 15:
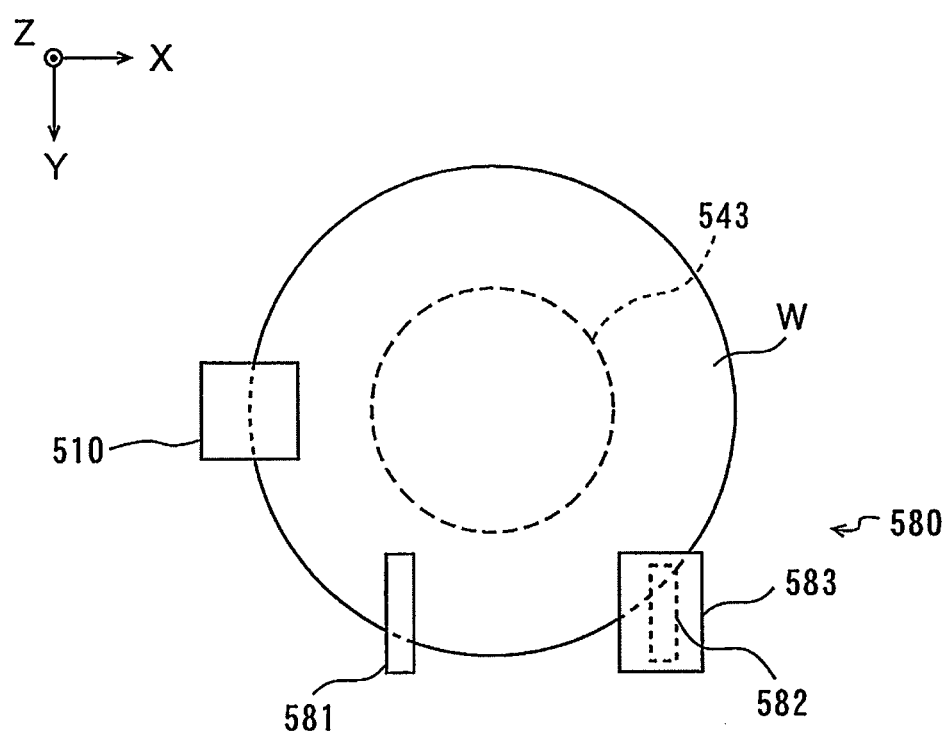
FIG. 15 a schematic plan view of the edge exposure unit.

Details of the edge exposure unit EEW will be described below. FIG. 13 schematically illustrates one side surface of the edge exposure unit EEW, and FIG. 14 schematically illustrates another side surface of the edge exposure unit EEW. FIG. 15 is a schematic plan view of the edge exposure unit EEW.

As illustrated in FIGS. 13 and 14, the edge exposure unit EEW includes a light projector 510, a light projector holding unit 520, a substrate rotation unit 540, and a state detection processing unit 580. The state detection processing unit 580 is connected to a state detection controller MC illustrated in FIG. 16, described below.

The light projector 510 is connected to an exposure light source (not illustrated), described below, via a light guide composed of an optical filter cable or the like. Thus, the light projector 510 irradiates the peripheral edge of the substrate W with light sent from the exposure light source via the light guide. The light irradiated onto the substrate W by the light projector 510 to expose the resist film on the substrate W is hereinafter referred to as exposure light.

The light projector holding unit 520 includes an X-direction driving motor 521, an X-direction ball screw 522, a light projector holding guide 523, a support 524, a Y-direction driving motor 531, a support holding guide 532, and a Y-direction ball screw 533.

The light projector holding guide 523 holds the light projector 510 to be movable in the X-direction. The X-direction ball screw 522 is threadably mounted on a coupler (not illustrated) provided in the light projector 510.

The X-direction ball screw 522 extends in the X-direction, and rotates in a direction indicated by an arrow R1 as the X-direction driving motor 521 operates. The light projector 510 moves in the X-direction when the X-direction ball screw 522 rotates.

The support 524 supports the X-direction driving motor 521 and the light projector holding guide 523 at a predetermined height. The support holding guide 532 holds a lower end of the support 524. The support holding guide 532 holds the support 524 to be movable in the Y-direction. The Y-direction ball screw 533 is threadably mounted on a coupler (not illustrated) provided in the support 524.

The Y-direction ball screw 533 extends in the Y-direction, and rotates in a direction indicated by an arrow R3 as the Y-direction driving motor 531 operates. The Y-direction ball screw 533 rotates so that the support 524 moves in the Y-direction.

The light projector 510 thus moves in the X-direction and the Y-direction by an operation of each part of the light projector holding unit 520.

The substrate rotation unit 540 includes a substrate rotation motor 541, a substrate rotation shaft 542, and a spin chuck 543. The substrate rotation shaft 542 projects upward from the substrate rotation motor 541. The spin chuck 543 is connected to an upper end of the substrate rotation shaft 542. The substrate W is placed on the spin chuck 543 during edge exposure processing. The spin chuck 543 adsorbs and holds the placed substrate W.

The substrate rotation motor 541 rotates the substrate rotation shaft 542 in a direction indicated by an arrow R2. Thus, the spin chuck 543 rotates, and the substrate W, which has been adsorbed and held by the spin chuck 543, rotates. The state detection processing unit 580 includes an illumination unit 581, a reflection mirror 582, and a charge-coupled device (CCD) line sensor 583.

As illustrated in FIG. 15, the illumination unit 581 is arranged above the peripheral edge of the substrate W along the Y-direction. The reflection mirror 582 is arranged above the substrate W to oppose the illumination unit 581. The CCD line sensor 583 is arranged above the reflection mirror 582. The CCD line sensor 583 is arranged so that a pixel arrangement direction is along the Y-direction.

Strip-shaped light (hereinafter referred to as illumination light) for detecting the state of the peripheral edge of the substrate W is generated from the illumination unit 581. The peripheral edge of the substrate W is irradiated with the illumination light. The irradiated illumination light is reflected on the substrate W, is further reflected on the reflected mirror 582, and is projected on the CCD line sensor 583. A distribution of amounts of light received by the CCD line sensor 583 corresponds to a distribution of brightnesses of light reflected by the peripheral edge of the substrate W.

The distribution of brightnesses of light reflected by the surface of the substrate W differs depending on the state of the peripheral edge of the substrate W. More specifically, if the anti-reflection film F1, the resist film F2, and the resist cover film F3 are formed on the substrate W, the distribution of brightnesses of light reflected by the surface of the substrate W differs depending on formation regions of the anti-reflection film F1, the resist film F2, and the resist cover film F3.

In the present embodiment, state detection processing for the peripheral edge of the substrate W, described below, is performed based on the distribution of amounts of light received by the CCD line sensor 583.

(9) Configuration of Control System of Substrate Processing System

Figure 16:
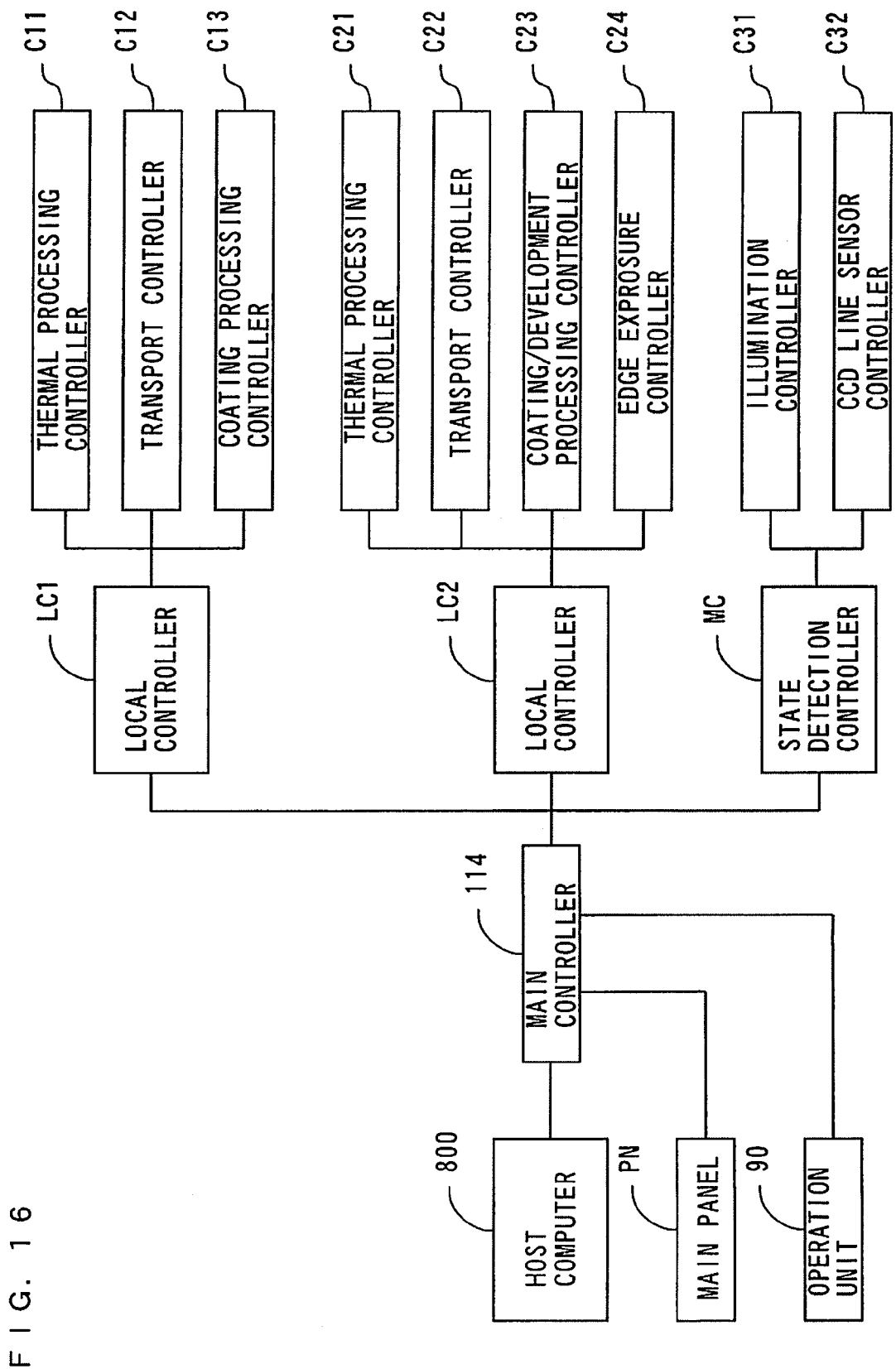
FIG. 16 is a block diagram illustrating a configuration of a control system of a substrate processing system.

FIG. 16 is a block diagram illustrating a configuration of a control system of the substrate processing system 1000. As illustrated in FIG. 16, a host computer 800 is connected to a main controller 114. A main panel PN and an operation unit 90 are connected to the main controller 114. Local controllers LC1 and LC2 and the state detection controller MC are connected to the main controller 114. Operation information of the operation unit 90 by the user is given to the main controller 114.

The local controller LC1 includes a thermal processing controller C11, a transport controller C12, and a coating processing controller C13. The thermal processing controller C11 controls the temperatures of the thermal processing unit PHP, the adhesion reinforcement processing unit PAHP, and the cooling unit CP in the thermal processing section 123 illustrated in FIG. 4. The transport controller C12 controls operations of the transport mechanisms 127 and 128 in the transport section 122 illustrated in FIG. 6.

The coating processing controller C13 controls an operation of the nozzle transport mechanism 29 (FIG. 1), an operation of the spin chuck 25, and supply of the processing liquid to each of the processing liquid nozzles 28 in the coating processing section 121 illustrated in FIG. 2. The coating processing controller C13 controls the rinse liquid supply system 30b illustrated in FIG. 3, to control supply of the rinse liquid to the edge rinse nozzle 30 while adjusting the flow rate of the rinse liquid discharged to the substrate W from the edge rinse nozzle 30. Further, the coating processing controller C13 controls the edge rinse nozzle driver 30a illustrated in FIG. 3, to control movement of the edge rinse nozzle 30 while controlling the discharge position of the rinse liquid to the substrate W from the edge rinse nozzle 30.

The local controller LC2 includes a thermal processing controller C21, a transport controller C22, a coating/development processing controller C23, and an edge exposure controller C24. The thermal processing controller C21 controls temperatures of the thermal processing unit PHP and the cooling unit CP in the thermal processing section 133 illustrated in FIG. 4. The transport controller C22 controls operations of the transport mechanisms 137 and 138 in the transport section 132 illustrated in FIG. 6.

The coating/development processing controller C23 controls an operation of the nozzle transport mechanism 29 (FIG. 1), an operation of the moving mechanism 39, an operation of the spin chucks 25 and 35, and supply of the processing liquid to each of the processing liquid nozzles 28 and supply of the development liquid to each of the slit nozzles 38 in the coating/development processing section 131 illustrated in FIG. 2.

The coating/development processing controller C23 controls the rinse liquid supply system 30b illustrated in FIG. 3, to control supply of the rinse liquid to the edge rinse nozzle 30 while adjusting the flow rate of the rinse liquid discharged to the substrate W from the edge rinse nozzle 30. Further, the coating/development processing controller C23 controls the edge rinse nozzle driver 30a illustrated in FIG. 3, to control movement of the edge rinse nozzle 30 while controlling the discharge position of the rinse liquid to the substrate W from the edge rinse nozzle 30.

The edge exposure controller C24 controls an operation of the X-direction driving motor 521 (FIG. 13), an operation of the Y-direction driving motor 531 (FIG. 13), an operation of the substrate rotation motor 541 (FIG. 13), and an operation of an exposure light source (not illustrated).

The state detection controller MC includes an illumination controller C31 and a CCD line sensor controller C32. The illumination controller C31 controls an operation of the illumination unit 581 illustrated in FIG. 13. The CCD line sensor controller C32 controls an operation of the CCD line sensor 583 illustrated in FIG. 13.

(10) State Detection Processing for Peripheral Edge of Substrate

The state detection processing for the peripheral edge of the substrate W will be described. In the state detection processing, the distribution of amounts of light received by the CCD line sensor 583 is given to the main controller 114 via the state detection controller MC. The state (edge cut widths D1 to D3) of the peripheral edge of the substrate W is inspected based on the distribution of amounts of light received by the CCD line sensor 583.

As described above, the distribution of amounts of light received by the CCD line sensor 583 corresponds to the distribution of brightnesses of light reflected by the peripheral edge of the substrate W. The whole peripheral edge of the substrate W is irradiated with illumination light when the substrate W rotates once. In a period during which the substrate W rotates once, the distribution of amounts of light received by the CCD line sensor 583 is continuously given to the main controller 114. The main controller 114 generates peripheral edge image data representing the distribution of brightnesses of light reflected by the peripheral edge of the substrate W based on the distribution of amounts of light received by the CCD line sensor 583.

Figure 17:
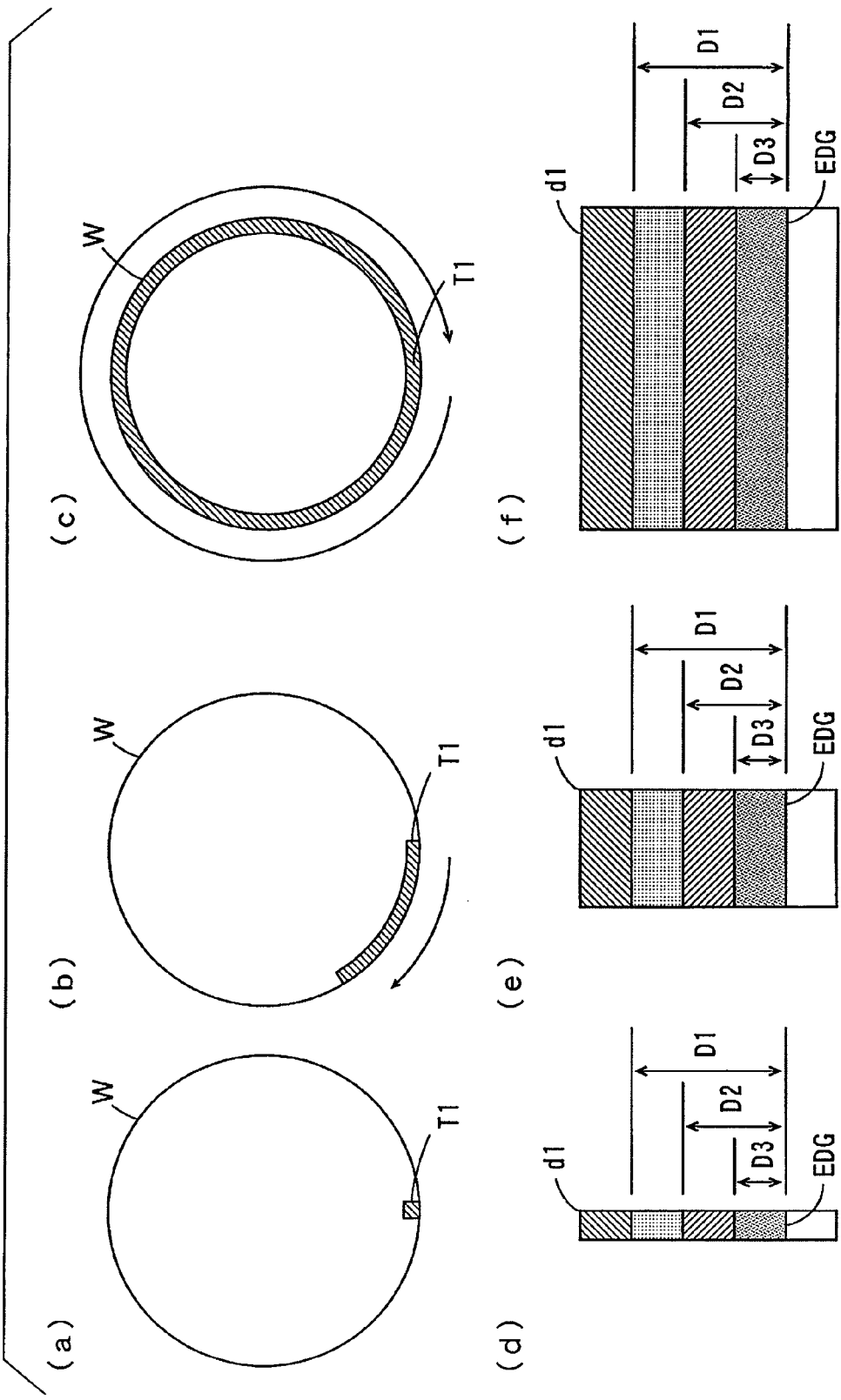
FIGS. 17 (a) to 17 (f) illustrate a method for generating peripheral edge image data.

FIG. 17 illustrates a method for generating the peripheral edge image data, where FIGS. 17 (a), 17(b), and 17(c) sequentially illustrate an irradiated state of illumination light on the substrate W, and FIGS. 17 (d), 17(e), and 17(f) respectively illustrate peripheral edge image data that are generated in the states illustrated in FIGS. 17 (a), 17(b), and 17(c). A region on the substrate W, which has been irradiated with the illumination light, is hatched in FIGS. 17 (a) to 17 (c). In FIGS. 17 (d) to 17 (f), the peripheral edge image data is displayed in a form of an image that is displayed based on the peripheral edge image data to facilitate the understanding.

As illustrated in FIGS. 17 (a) to 17 (c), the substrate W rotates while the peripheral edge of the substrate W is continuously irradiated with the illumination light. Thus, the illumination light is continuously irradiated in a circumferential direction of the substrate W. The whole peripheral edge of the substrate W is irradiated with the illumination light when the substrate W rotates once.

Rectangular peripheral edge image data d1 is generated, as illustrated in FIGS. 17 (d) to 17 (f), based on the distribution of amounts of light received by the CCD line sensor 583, which is continuously obtained in a period during which the substrate W rotates once.

A position in a longitudinal direction of the peripheral edge image data d1 corresponds to a position of each of pixels composing the CCD line sensor 583 (a position in a radial direction of the substrate W), and a position in a transverse direction of the peripheral edge image data d1 corresponds to a rotation angle of the substrate W.

In this case, a change in the longitudinal direction of the peripheral edge image data d1 represents a distribution of brightnesses of light reflected in the radial direction of the substrate W in a region T1 at the peripheral edge of the substrate W. A change in the transverse direction of the peripheral edge image data d1 represents a distribution of brightnesses of light reflected by the region T1 at the peripheral edge of the substrate W in the circumferential direction of the substrate W. The edge cut widths D1 to D3 can be calculated based on a distance from a position of an outer peripheral portion EDG of the substrate W in the peripheral edge image data d1.

At the time point where the substrate W rotates once, a distribution of brightnesses of light reflected by the whole peripheral edge of the substrate W is obtained as one rectangular peripheral edge image data d1. Based on the peripheral edge image data d1, an image at the peripheral edge of the substrate W (hereinafter referred to as a peripheral edge image) is displayed.

FIG. 18 illustrates a distribution of brightnesses of the peripheral edge image displayed based on the peripheral edge image data d1. In an example illustrated in FIG. 18 (a), edge cut widths D1 to D3 are approximately constant and within an allowable range over the whole peripheral edge of the substrate W. In this case, it is determined that an amount of eccentricity of the substrate W on the spin chuck 25 is an allowable upper-limit value or less, and the flow rate of the rinse liquid discharged to the substrate W from the edge rinse nozzle 30 and the discharge position of the rinse liquid are appropriate.

In an example illustrated in FIG. 18 (b), the edge cut widths D1 to D3 greatly change, although an average value of each of the edge cut widths is within the allowable range over the whole peripheral edge of the substrate W. In this case, it is determined that the amount of eccentricity of the substrate W on the spin chuck 25 exceeds the allowable upper-limit value, although the flow rate of the rinse liquid discharged to the substrate W from the edge rinse nozzle 30 and the discharge position of the rinse liquid are appropriate.

In an example illustrated in FIG. 18 (c), each of the edge cut widths D1 to D3 is smaller than a lower-limit value of the allowable range, although substantially constant over the whole peripheral edge of the substrate W. In this case, it is determined that the flow rate of the rinse liquid discharged to the substrate W from the edge rinse nozzle 30 and the discharge position of the rinse liquid are not appropriate, although the amount of eccentricity of the substrate W on the spin chuck 25 is the allowable upper-limit value or less.

In an example illustrated in FIG. 18 (d), each of the edge cut widths D1 to D3 greatly changes over the whole peripheral edge of the substrate W, and an average value of the edge cut width is smaller than the lower-limit value of the allowable range. In this case, it is determined that the amount of eccentricity of the substrate W on the spin chuck 25 exceeds the allowable upper-limit value and the flow rate of the rinse liquid discharged to the substrate W from the edge rinse nozzle 30 and the discharge position of the rinse liquid are not appropriate.

Figure 19:
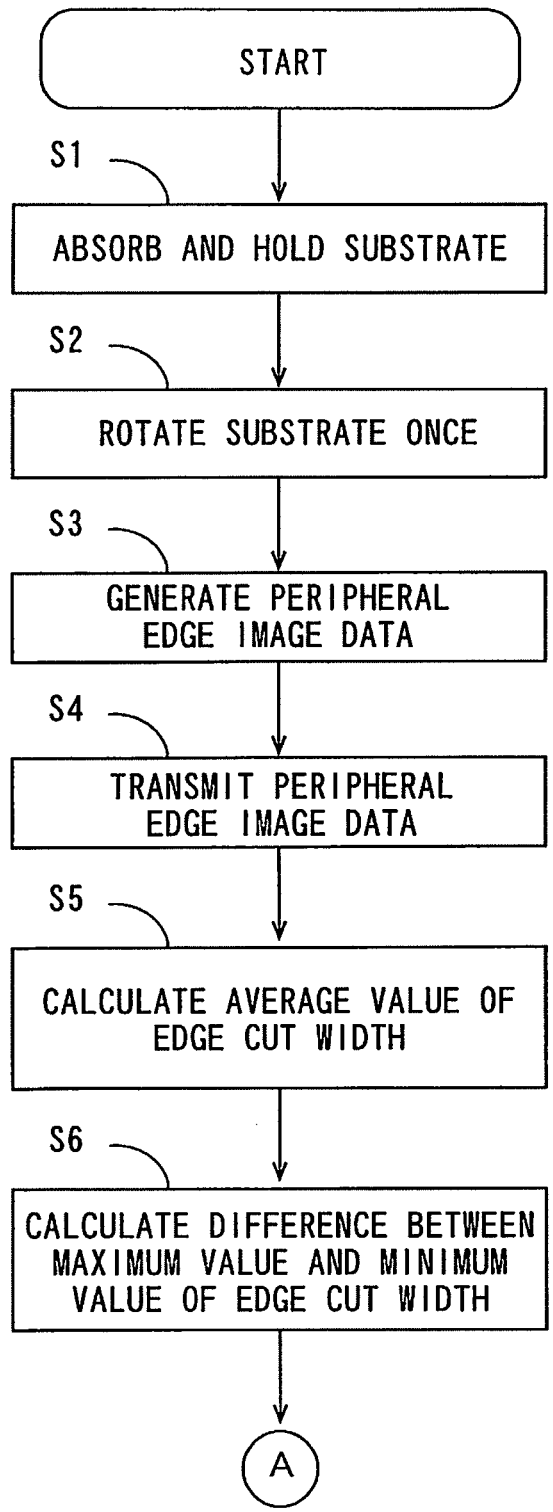
FIG. 19 is a flow chart illustrating an operation of a main controller illustrated in FIG. 16.
Figure 20:
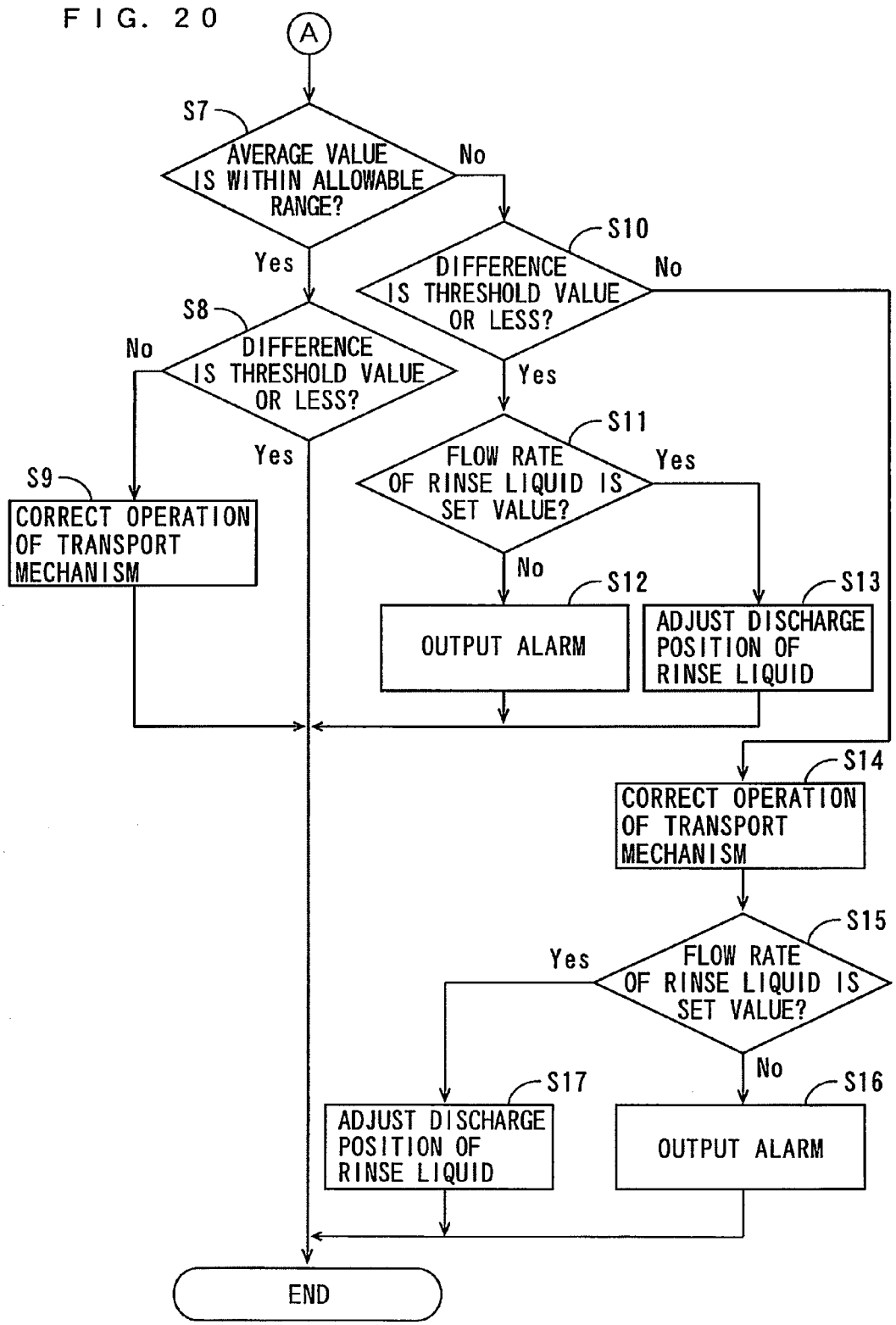
FIG. 20 is a flow chart illustrating an operation of a main controller illustrated in FIG. 16.

FIGS. 19 and 20 are flow charts illustrating an operation of the main controller 114 illustrated in FIG. 16. While processing for detecting a state of the peripheral edge of the substrate W for the edge cut width D1 will be described below, processing for detecting states of the peripheral edge of the substrate W for the edge cut widths D2 and D3 is similar to the processing for detecting the state of the peripheral edge of the substrate W for the edge cut width D1.

The main controller 114 controls the transport mechanism 137 illustrated in FIG. 6 through the local controller LC2 and the transport controller C22, to place the substrate W on the spin chuck 543 in the edge exposure unit EEW illustrated in FIG. 13, and controls the spin chuck 543 illustrated in FIG. 13 through the local controller LC2 and the edge exposure controller C24, to adsorb and hold the substrate W on the spin chuck 543 (step S1).

The main controller 114 controls the spin chuck 543 through the local controller LC2 and the edge exposure controller C24, to rotate the substrate W held by the spin chuck 543 once (step S2). The main controller 114 generates the peripheral edge image data d1 based on the distribution of amounts of light received by the CCD line sensor 583 illustrated in FIG. 13 in a period during which the substrate W rotates once (step S3).

The main controller 114 transmits the generated peripheral edge image data d1 to the host computer 800 illustrated in FIG. 16 (step S4). The host computer 800 stores the peripheral edge image data d1 from the main controller 114. The user can confirm the peripheral edge image data d1, as needed, using the host computer 800 or a terminal device connected to the host computer 800.

The main controller 114 may store the peripheral edge image data d1. In the case, the user can confirm the peripheral edge image data d1 using the main panel PN illustrated in FIG. 1, as needed. The main controller 114 can transmit the peripheral edge image data d1 from the main controller 114 to the host computer 800 at any timing.

The main controller 114 then calculates an average value of the edge cut width D1 based on the generated peripheral edge image data d1 (step S5). The main controller 114 calculates a difference between a maximum value and a minimum value of the edge cut width D1 based on the generated peripheral edge image data d1 (step S6). The difference between the maximum value and the minimum value of the edge cut width D1 corresponds to a variation (an amount of change) of the edge cut width D1.

The main controller 114 then determines whether the average value of the edge cut width D1, which has been calculated in step S5, of the substrate W is within a previously set allowable range or not (step S7). If the average value of the edge cut width D1 is within the allowable range, the main controller 114 determines that the flow rate of the rinse liquid discharged to the substrate W from the edge rinse nozzle 30 in the coating processing chamber 21 (or the coating processing chamber 23) illustrated in FIG. 2 and the discharge position of the rinse liquid are appropriate.

The main controller 114 further determines whether the difference between the maximum value and the minimum value of the edge cut width D1, which has been calculated in step S6, is a previously set threshold value or less or not (step S8). If the difference between the maximum value and the minimum value of the edge cut width D1 is the threshold value or less, the main controller 114 determines that the amount of eccentricity of the substrate W on the spin chuck 25 is the allowable upper-limit value or less in the coating processing chamber 21 (or the coating processing chamber 23) illustrated in FIG. 2. A peripheral edge image based on the peripheral edge image data d1 for the substrate W at this time is illustrated in FIG. 18 (a). The main controller 114 then finishes the state detection processing for the peripheral edge of the substrate W.

In step S8, if the difference between the maximum value and the minimum value of the edge cut width D1 exceeds the threshold value, the main controller 114 determines that the amount of eccentricity of the substrate W on the spin chuck 25 exceeds the allowable upper-limit value in the coating processing chamber 21 (or the coating processing chamber 23). A peripheral edge image based on the peripheral edge image data d1 for the substrate W at this time is illustrated in FIG. 18 (b).

In this case, the main controller 114 corrects an operation of the transport mechanism 127 (or the transport mechanism 128) through the local controller LC1 and the transport controller C12 so that the amount of eccentricity of the substrate W on the spin chuck 25 in the coating processing chamber 21 (or the coating processing chamber 23) is reduced (step S9). The main controller 114 then finishes the state detection processing for the peripheral edge of the substrate W.

In step S7, if the average value of the edge cut width D1 is outside the allowable range, the main controller 114 determines that the flow rate of the rinse liquid to the substrate W from the edge rinse nozzle 30 in the coating processing chamber 21 (or the coating processing chamber 23) illustrated in FIG. 2 or the discharge position of the rinse liquid are not appropriate.

In this case, the main controller 114 determines whether the difference between the maximum value and the minimum value of the edge cut width D1, which has been calculated in step S6, is the threshold value or less or not (step S10). If the difference between the maximum value and the minimum value of the edge cut width D1 is the threshold value or less, the main controller 114 determines that the amount of eccentricity of the substrate W on the spin chuck 25 is the allowable upper-limit value or less in the coating processing chamber 21 (or the coating processing chamber 23) illustrated in FIG. 2. A peripheral edge image based on the peripheral edge image data d1 for the substrate W at this time is illustrated in FIG. 18 (c).

The main controller 114 thus determines whether the flow rate of the rinse liquid measured by the flow sensor in the rinse liquid supply system 30b illustrated in FIG. 3 is equal to a set value or not (step S11). If the flow rate of the rinse liquid differs from the set value, then the main controller 114 outputs an alarm (step S12). The alarm is output by generating an alarm sound using a buzzer or the like or displaying an alarm using a lamp or the like, for example. Then, the main controller 114 finishes the state detection processing for the peripheral edge of the substrate W.

In step S11, if the flow rate of the rinse liquid is equal to the set value, the main controller 114 determines that the discharge position of the rinse liquid from the edge rinse nozzle 30 is not appropriate. In this case, the main controller 114 controls the edge rinse nozzle driver 30a illustrated in FIG. 3 through the local controller LC1 and the coating processing controller C13, to adjust the discharge position of the rinse liquid from the edge rinse nozzle 30 (step S13). If the average value of the edge cut width D1, which has been calculated in step S5, is smaller than the lower-limit value of the allowable range, for example, the main controller 114 moves the edge rinse nozzle 30 by a predetermined amount nearer to the center of the substrate W. On the other hand, if the average value of the edge cut width D1, which has been calculated in step S5, is more than the upper-limit value of the allowable range, the main controller 114 moves the edge rinse nozzle 30 by a predetermined amount away from the center of the substrate W. Then, the main controller 114 finishes the state detection processing for the peripheral edge of the substrate W.

In step S10, if the difference between the maximum value and the minimum value of the edge cut width D1 exceeds the threshold value, the main controller 114 determines that the amount of eccentricity of the substrate W on the spin chuck 25 exceeds the allowable upper-limit value in the coating processing chamber 21 (or the coating processing chamber 23). A peripheral edge image based on the peripheral edge image data d1 for the substrate W at this time is illustrated in FIG. 18 (d). In this case, the main controller 114 corrects an operation of the transport mechanism 127 (or the transport mechanism 128) through the local controller LC1 and the transport controller C12 so that the amount of eccentricity of the substrate W on the spin chuck 25 in the coating processing chamber 21 (or the coating processing chamber 23) is reduced (step S14).

The main controller 114 then determines whether the flow rate of the rinse liquid measured by the flow sensor in the rinse liquid supply system 30b illustrated in FIG. 3 is equal to the set value or not (step S15). If the flow rate of the rinse liquid differs from the set value, then the main controller 114 outputs an alarm (step S16). Then, the main controller 114 finishes the state detection processing for the peripheral edge of the substrate W.

In step S15, if the flow rate of the rinse liquid is equal to the set value, then the main controller 114 controls the edge rinse nozzle driver 30a illustrated in FIG. 3 through the local controller LC1 and the coating processing controller C13, to adjust the discharge position of the rinse liquid from the edge rinse nozzle 30 (step S17). Then, the main controller 114 finishes the state detection processing for the peripheral edge of the substrate W.

While the outer peripheral portion EDG of the substrate W in the peripheral edge image data d1 is a straight line in the example illustrated in FIG. 18, the outer peripheral portion EDG of the substrate W in the peripheral edge image data d1 is not a straight line if the center of the substrate W is eccentric from the axis of the spin chuck 543 in the edge exposure unit EEW. In this case, the amount of eccentricity of the substrate W on the spin chuck 25 as well as the flow rate of the rinse liquid discharged to the substrate W from the edge rinse nozzle 30 and the discharge position of the rinse liquid can also be determined based on the edge cut widths D1 to D3.

(11) Effects

In the substrate processing apparatus 100 according to the present embodiment, the edge cut widths D1 to D3 of the substrate W are easily detected by image processing for the state detection processing unit 580. The main controller 114 can reliably detect that the center W1 of the substrate W has been placed on the spin chuck 25 to be eccentric from the axis P1 of the spin chuck 25 by determining whether the difference between the maximum value and the minimum value of each of the detected edge cut widths D1 to D3 is a threshold value or less or not.

The main controller 114 corrects operations of the transport mechanisms 127, 128, 137, and 138 through the local controllers LC1 and LC2 and the transport controllers C12 and C22 so that the amount of eccentricity of the substrate W on the spin chuck 25 is reduced if it detects that the center W1 of the substrate W has been placed on the spin chuck 25 to be eccentric from the axis P1 of the spin chuck 25. This can result in an improvement in the accuracy of substrate processing.

The main controller 114 can reliably detect that the flow rate of the rinse liquid discharged to the substrate W from the edge rinse nozzle 30 in the coating processing unit 129 and the discharge position of the rinse liquid are not appropriate by determining whether the average value of each of the edge cut widths D1 to D3 is within the allowable range or not.

The main controller 114 can notify the worker that the flow rate of the rinse liquid is not appropriate by outputting the alarm if it detects that the flow rate of the rinse liquid discharged to the substrate W from the edge rinse nozzle 30 is not appropriate. Thus, the worker can adjust the set value of the flow rate of the rinse liquid so that the average value of each of the edge cut widths D1 to D3 is within the allowable range or can make the flow rate of the rinse liquid appropriate by maintaining the rinse liquid supply system 30b. This can result in an improvement in the accuracy of the substrate processing.

The main controller 114 controls the edge rinse nozzle driver 30a illustrated in FIG. 3 through the local controllers LC1 and LC2, the coating processing controller C13, and the coating/development processing controller C23 to adjust the discharge position of the rinse liquid from the edge rinse nozzle 30 if it detects that the discharge position of the rinse liquid is not appropriate. This can result in an improvement in the accuracy of the substrate processing.

The above-mentioned state detection processing for the peripheral edge of the substrate W may be performed when the substrate processing apparatus 100 is taught or maintained outside operating hours of the substrate processing apparatus 100, or may be performed within the operating hours of the substrate processing apparatus 100.

(12) Other Embodiments (12-1) While in the above-mentioned embodiment, the main controller 114 corrects the operation of the transport mechanism 127 when the difference between the maximum value and the minimum value of the edge cut width D1 exceeds the previously set threshold value in the processing in step S9 or S14 in the state detection processing for the peripheral edge of the substrate W, the present invention is not limited to this. If the difference between the maximum value and the minimum value of the edge cut width D1 exceeds the previously set threshold value, the main controller 114 may output an alarm instead of the processing in step S9 or S14. Thus, the worker can recognize that the center W1 of the substrate W has been placed on the spin chuck 25 to be eccentric from the axis P1 of the spin chuck 25. In this case, the worker can adjust the transport mechanism 127 so that the center W1 of the substrate W matches the axis P1 of the spin chuck 25.

(12-2) While in the above-mentioned embodiment, the main controller 114 outputs the alarm when the flow rate of the rinse liquid differs from the set value in the processing in step S12 or S16 in the state detection processing for the peripheral edge of the substrate W, the present invention is not limited to this. If the flow rate of the rinse liquid differs from the set value, the main controller 114 may adjust the flow rate of the rinse liquid in the rinse liquid supply system 30b so that the average value of the edge cut width D1 is within the allowable range instead of the processing in step S12 or S16.

(12-3) While in the above-mentioned embodiment, the main controller 114 adjusts the discharge position of the rinse liquid when the flow rate of the rinse liquid is equal to the set value in the processing in steps S13 or S17 in the state detection processing for the peripheral edge of the substrate W, the present invention is not limited to this. If the flow rate of the rinse liquid differs from the set value, the main controller 114 may output an alarm instead of the processing in step S13 or S17. Thus, the worker can recognize that the discharge position of the rinse liquid is not appropriate. In this case, the worker can make the discharge position of the rinse liquid appropriate by maintaining the edge rinse nozzle driver 30a.

(12-4) While in the above-mentioned embodiment, the state detection processing unit 580 is provided in the edge exposure unit EEW, the present invention is not limited to this. The state detection processing unit 580 may be provided in another units such as the coating processing unit 129 or the development processing unit 139.

A macro inspection device that inspects a surface state of a substrate W may be provided as the state detection processing unit 580. In this case, a CCD camera of the macro inspection device captures an image of the surface of the substrate W. Based on the captured image of the surface of the substrate W, the edge cut widths D1 to D3 are calculated.

(13) Correspondences between Elements in the Claims and Parts in Embodiments

In the following paragraphs, non-limiting examples of correspondences between various elements recited in the claims below and those described above with respect to various preferred embodiments of the present invention are explained.

In the embodiments, described above, the substrate W is an example of a substrate, the substrate processing apparatus 100 is an example of a substrate processing apparatus, the coating processing unit 129 is an example of a film formation unit, the edge exposure unit EEW is an example of a detection unit 129 and an edge exposure unit, and the main controller 114 is an example of a controller. The spin chuck 25 is an example of a first rotating and holding unit, the processing liquid nozzle 28 is an example of a processing liquid supplier, and the edge rinse nozzle 30 is an example of a removal liquid supplier.

The spin chuck 543 is an example of a second rotating and holding device, the state detection processing unit 580 is an example of a position detector, the peripheral edge image data d1 is an example of image data, the CCD line sensor 583 is an example of an image data detector, and the edge cut widths D1 to D3 are examples of a width. The hands H1 and H2 are examples of a holder, and the transport mechanisms 127, 128, 137 and 138 are examples of a substrate transport device.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing apparatus that processes a substrate having an outer peripheral portion, at least a part of which is circular, comprising:
    a film formation unit that forms a film of a processing liquid on the substrate;
    a detection unit that detects a state of the substrate after film formation by said film formation unit; and
    a controller that makes determination based on a detection result of said detection unit,
    wherein said film formation unit includes
    a first rotating and holding device that holds and rotates the substrate,
    a processing liquid supplier that supplies the processing liquid onto the substrate rotated by said first rotating and holding device, to form a film of the processing liquid, and
    a removal liquid supplier that supplies a removal liquid to a peripheral edge of the substrate rotated by said first rotating and holding device, to remove the processing liquid on the peripheral edge of the substrate,
    said detection unit includes
    a second rotating and holding device that holds and rotates the substrate, and
    a position detector that detects a position of the outer peripheral portion of the substrate rotated by said second rotating and holding device and a position of an outer peripheral portion of the film on the substrate, and
    said controller determines a positional deviation of the center of the substrate held in said first rotating and holding device from a rotation center of said first rotating and holding device based on the position of the outer peripheral portion of the substrate and the position of the outer peripheral portion of the film on the substrate, which have been detected by said position detector, while determining a supply state of the removal liquid supplied by said removal liquid supplier in said film formation unit based on the position of the outer peripheral portion of the substrate and the position of the outer peripheral portion of the film on the substrate, which have been detected by said position detector, wherein the supply state of the removal liquid includes a position of a supply nozzle that supplies the removal liquid to the outer peripheral portion of the substrate from said removal liquid supplier.

2. The substrate processing apparatus according to claim 1, wherein said position detector includes an image data detector that detects image data representing a position of the outer peripheral portion of the substrate rotated by the second rotating and holding device and the position of the outer peripheral portion of the film on the substrate, and the controller detects a change in the position of the outer peripheral portion of the substrate in a radial direction of the substrate and a change in the position of the outer peripheral portion of the film on the substrate based on the image data detected by said image data detector, and determines the positional deviation of the center of the substrate based on the detected change in the position of the outer peripheral portion of the substrate and the detected change in the position of the outer peripheral portion of the film on the substrate, while determining said supply state of the removal liquid based on the detected change in the position of the outer peripheral portion of the substrate and the detected change in the position of the outer peripheral portion of the film on the substrate.

3. The substrate processing apparatus according to claim 2, wherein the controller calculates the width of the outer peripheral portion, where no film exists, of the substrate based on the change in the position of the outer peripheral portion of the substrate in the radial direction of the substrate and the change in the position of the outer peripheral portion of the film on the substrate, and determines the positional deviation of the center of the substrate based on the calculated width while determining said supply state of the removal liquid based on the calculated width.

4. The substrate processing apparatus according to claim 3, wherein said controller determines the positional deviation of the center of said substrate based on a difference between a maximum value and a minimum value of the calculated width while determining said supply state of the removal liquid based on an average value of the calculated width.

5. The substrate processing apparatus according to claim 1, further comprising a substrate transport device including a holder that holds and transports the substrate while placing the held substrate on said first rotating and holding device in said film formation unit, wherein said controller adjusts a placement operation of the substrate on said first rotating and holding device by said holder in said transport device based on a determination result of the positional deviation of the center of said substrate.

6. The substrate processing apparatus according to claim 1, wherein said controller at least outputs an alarm or adjusts said supply state of the removal liquid by said removal liquid supplier when a determination result of said supply state of the removal liquid by said controller represents an abnormality.

7. The substrate processing apparatus according to claim 1, wherein said film formation unit forms a photosensitive film as said film of the processing liquid, and said detection unit is an edge exposure unit further having a function of performing exposure processing for the peripheral edge of the film on the substrate.

8. The substrate processing apparatus according to claim 1, wherein said controller calculates a width of the outer peripheral portion, where no film exists, of the substrate based on a change in the position of the outer peripheral portion of the substrate in a radial direction of the substrate and a change in the position of the outer peripheral portion of the film on the substrate, and determines the position of the supply nozzle that supplies the removal liquid to the outer peripheral portion of the substrate from said removal liquid supplier, based on the calculated width.

9. A substrate processing apparatus that processes a substrate having an outer peripheral portion, at least a part of which is circular, comprising:

a film formation unit that forms a film of a processing liquid on the substrate;

a detection unit that detects a state of the substrate after film formation by said film formation unit; and a controller that makes determination based on a detection result of said detection unit, wherein said film formation unit includes a first rotating and holding device that holds and rotates the substrate, a processing liquid supplier that supplies the processing liquid onto the substrate rotated by said first rotating and holding device, to form a film of the processing liquid, and a removal liquid supplier that supplies a removal liquid to a peripheral edge of the substrate rotated by said first rotating and holding device, to remove the processing liquid on the peripheral edge of the substrate, said detection unit includes a second rotating and holding device that holds and rotates the substrate, and a position detector that detects a position of the outer peripheral portion of the substrate rotated by said second rotating and holding device and a position of an outer peripheral portion of the film on the substrate, and said controller determines a positional deviation of the center of the substrate held in said first rotating and holding device from a rotation center of said first rotating and holding device based on the position of the outer peripheral portion of the substrate and the position of the outer peripheral portion of the film on the substrate, which have been detected by said position detector, while determining a supply state of the removal liquid supplied by said removal liquid supplier in said film formation unit based on the position of the outer peripheral portion of the substrate and the position of the outer peripheral portion of the film on the substrate, which have been detected by said position detector, wherein the supply state of the removal liquid includes a flow rate of the removal liquid supplied to the outer peripheral portion of the substrate by said removal liquid supplier.

10. The substrate processing apparatus according to claim 9, wherein said controller calculates a width of the outer peripheral portion, where no film exists, of the substrate based on a change in the position of the outer peripheral portion of the substrate in a radial direction of the substrate and a change in the position of the outer peripheral portion of the film on the substrate, and determines the flow rate of the removal liquid supplied to the outer peripheral portion of the substrate by said removal liquid supplier, based on the calculated width.

* * * * *